US011422206B2

(12) United States Patent
Livshitz et al.

(10) Patent No.: US 11,422,206 B2
(45) Date of Patent: Aug. 23, 2022

(54) MAGNETIC FIELD SENSOR WITH OPTIMIZED COIL CONFIGURATIONS FOR FLUX GUIDE RESET

(71) Applicant: Robert Bosch GmbH, Stuttgart (DE)

(72) Inventors: Boris Livshitz, San Bruno, CA (US); Phillip Mather, Phoenix, AZ (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/104,262

(22) Filed: Nov. 25, 2020

(65) Prior Publication Data

US 2022/0163604 A1  May 26, 2022

(51) Int. Cl.
*G01R 33/00* (2006.01)
(52) U.S. Cl.
CPC ...... *G01R 33/0011* (2013.01); *G01R 33/0047* (2013.01); *G01R 33/0017* (2013.01)
(58) Field of Classification Search
CPC ............ G01R 33/0011; G01R 33/0047; G01R 33/0017
USPC .................................................... 324/207.11
See application file for complete search history.

(56) References Cited

U.S. PATENT DOCUMENTS

| 9,588,211 | B2 | 3/2017 | Liu et al. |
| 9,720,051 | B2 | 8/2017 | Holm et al. |
| 9,910,106 | B2 | 3/2018 | Mather et al. |
| 2015/0192655 | A1* | 7/2015 | Liu ..................... G01R 33/0011 324/244 |
| 2016/0202329 | A1* | 7/2016 | Paci ..................... G01R 33/093 324/252 |
| 2017/0059361 | A1* | 3/2017 | Nagarkar ............ G01R 33/0017 |
| 2020/0319265 | A1* | 10/2020 | Gider .................. G01R 33/091 |
| 2020/0371171 | A1 | 11/2020 | Mohan et al. |
| 2021/0293902 | A1* | 9/2021 | Makino .............. G01R 33/0017 |

FOREIGN PATENT DOCUMENTS

| EP | 3109657 A1 * | 12/2016 | ......... G01R 33/0011 |
| WO | WO-2016197840 A1 * | 12/2016 | ......... G01R 33/0005 |

* cited by examiner

*Primary Examiner* — Christopher P McAndrew
(74) *Attorney, Agent, or Firm* — Kathy Takeguchi

(57) ABSTRACT

A sensor structure includes sensing elements, a flux guide, and a flux guide reset mechanism. The flux guide is configured to guide magnetic flux in a plane for detection by the sensing elements. The flux guide reset mechanism is configured to set the flux guide to a predetermined magnetic orientation. The flux guide reset mechanism includes at least a first coil and a second coil. The first coil is configured to generate a first magnetic field. The first coil includes first coil segments. The second coil is configured to generate a second magnetic field. The second coil includes second coil segments. The flux guide is disposed between the first coil and the second coil. The first coil segments and the second coil segments are configured such that a first magnetic field profile of the first magnetic field is coherent with a second magnetic field profile of the second magnetic field with respect to at least at a region of the flux guide that overlaps the sensing elements.

16 Claims, 14 Drawing Sheets

MAGNETIC FIELD SENSOR WITH OPTIMIZED COIL CONFIGURATIONS FOR FLUX GUIDE RESET

FIELD

This disclosure relates generally to sensors, and more specifically to magnetic field sensors.

BACKGROUND

A sensor device may include magnetoresistive sensors, which are configured to detect in-plane magnetic fields. In addition, the sensor device may include a flux guide to guide an out-of-plane field, such as the z-axis field, into an xy-plane to be sensed by an in-plane magnetoresistive sensor. The flux guide has a preferred uniform magnetization orientation for optimal z-axis response. The preferred magnetization orientation may be disturbed, for example, by exposure to a very large external magnetic field, which may introduce magnetic domains separated by domain walls in the flux guide. This may result in a lower signal to noise ratio (SNR) and a shift in the offset reading of the magnetoresistive sensor. The uniform magnetization orientation of the flux guide can be reset by a reset operation. However, such reset operations typically rely on large operating currents, thereby being reliant on relatively large voltage overhead and/or significant power consumption. The relatively large operating requirements tend to make the sensor devices with flux guide reset mechanisms unsuitable for mobile and smart phone applications.

SUMMARY

The following is a summary of certain embodiments described in detail below. The described aspects are presented merely to provide the reader with a brief summary of these certain embodiments and the description of these aspects is not intended to limit the scope of this disclosure. Indeed, this disclosure may encompass a variety of aspects that may not be explicitly set forth below.

According to at least one aspect, a sensor structure includes sensing elements, a flux guide, and a flux guide reset mechanism. The flux guide is configured to guide magnetic flux in at least a plane for detection by the sensing elements. The flux guide reset mechanism is configured to set the flux guide to a predetermined magnetic orientation. The flux guide reset mechanism includes a first coil and a second coil. The first coil is configured to generate a first magnetic field. The second coil is configured to generate a second magnetic field. The flux guide is disposed between the first coil and the second coil. The first coil segments and the second coil segments are arranged in relation to each other such that a first magnetic field profile of the first magnetic field is coherent with a second magnetic field profile of the second magnetic field with respect to at least at a portion of the flux guide that overlaps the sensing elements.

According to at least one aspect, a sensor structure includes sensing elements, a flux guide, and a flux guide reset mechanism. The flux guide is configured to guide magnetic flux in at least a plane for detection by the sensing elements. The flux guide reset mechanism is configured to set the flux guide to a predetermined magnetic orientation. The flux guide reset mechanism includes at least a first coil and a second coil. The first coil is configured to generate a first magnetic field. The first coil includes first coil segments that overlap the flux guide. The second coil is configured to generate a second magnetic field. The second coil includes second coil segments that overlap the flux guide. The third coil is configured to generate a third magnetic field. The third coil includes third coil segments that overlap the flux guide. The flux guide has one side that faces the first coil and another side that faces the second coil and the third coil. The flux guide reset mechanism is configured such that a number of second coil segments that overlap the flux guide is less than a number of third coil segments that overlap the flux guide.

According to at least one aspect, a sensor structure includes sensing elements, a flux guide, and a flux guide reset mechanism. The flux guide is configured to guide magnetic flux in at least a plane for detection by the sensing elements. The flux guide reset mechanism is configured to set the flux guide to a predetermined magnetic orientation. The flux guide reset mechanism includes a first coil and a second coil. The first coil is configured to generate a first magnetic field. The first coil including first coil segments that overlap the flux guide. The second coil is configured to generate a second magnetic field. The second coil includes second coil segments that overlap the flux guide. The third coil is configured to generate a third magnetic field. The third coil includes third coil segments that overlap the flux guide. The flux guide has one side that faces the first coil and another side that faces the second coil and the third coil. The first coil segments and the third coil segments are configured such that a first magnetic field profile of the first magnetic field is coherent with a third magnetic field profile of the third magnetic field with respect to at least at a portion of the flux guide that overlaps the sensing elements.

These and other features, aspects, and advantages of the present invention are discussed in the following detailed description in accordance with the accompanying drawings throughout which like characters represent similar or like parts.

DETAILED DESCRIPTION

The embodiments described herein, which have been shown and described by way of example, and many of their advantages will be understood by the foregoing description, and it will be apparent that various changes can be made in the form, construction, and arrangement of the components without departing from the disclosed subject matter or without sacrificing one or more of its advantages. Indeed, the described forms of these embodiments are merely explanatory. These embodiments are susceptible to various modifications and alternative forms, and the following claims are intended to encompass and include such changes and not be limited to the particular forms disclosed, but rather to cover all modifications, equivalents, and alternatives falling with the spirit and scope of this disclosure.

Figure 1:
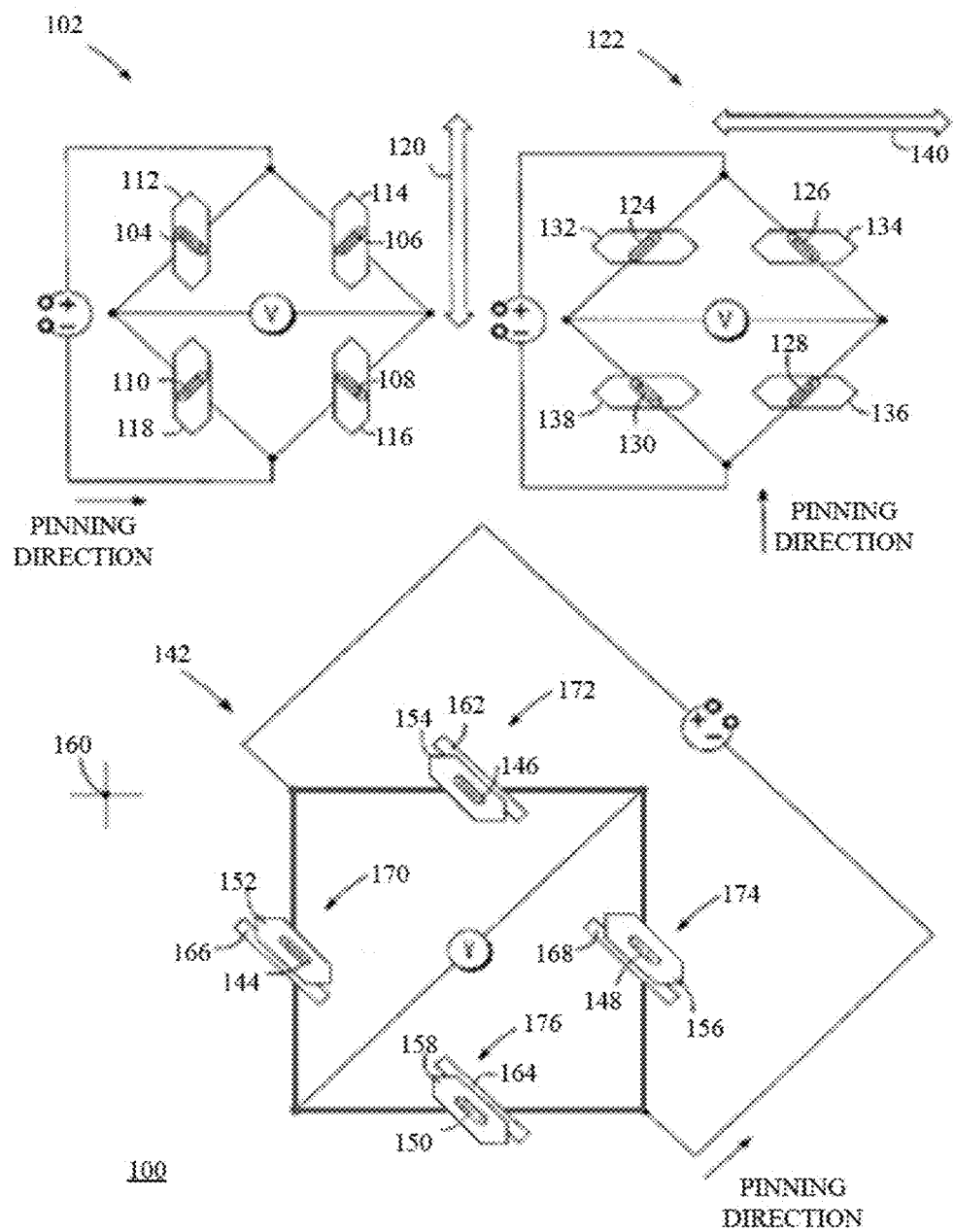
FIG. 1 is a diagram of an example of a magnetic field sensor that includes three differential sensors in which each differential sensor is formed with sensing elements that are connected in a Wheatstone bridge configuration.

FIG. 1 shows a schematic diagram of an example of a magnetoresistive (MR) sensor 100. The MR sensor includes a first differential sensor 102, a second differential sensor 122, and a third differential sensor 142 for detecting the component directions of an applied field along a first axis 120 (e.g., the y-axis direction), a second axis 140 (e.g., the x-axis direction), and a third axis 160 (e.g., the z-axis direction), respectively. Each of the first differential sensor 102, the second differential sensor 122, and the third differential sensor 142 is formed with unshielded sensing elements that are connected in a Wheatstone bridge configuration. Thus, the first differential sensor 102 is formed from the connection of a plurality of sensing elements 104, 106, 108, 110 in a bridge configuration over a corresponding plurality of pinned layers 112, 114, 116, 118, where each of the pinned layers 112-118 is magnetized in the x-axis direction. In similar fashion, the second differential sensor 122 is formed from the connection of a plurality of sensing elements 124, 126, 128, 130 in a bridge configuration over a corresponding plurality of pinned layers 132, 134, 136, 138 that are each magnetized in the y-axis direction that is perpendicular to the magnetization direction of the pinned layers 112, 114, 116, and 118.

Also, the third differential sensor 142 is in the same plane as the first sensor 102 and the second sensor 122. The third differential sensor 142 is formed from the connection of a plurality of sensing elements 144, 146, 148, 150 in a bridge configuration over a corresponding plurality of pinned layers 152, 154, 156, 158 that are each magnetized along an in-plane direction. In this third bridge configuration, the sensing elements 144, 146, 148, and 150 all have an easy axis magnetization direction that is orthogonal to the pinned magnetization direction of the pinned layers 152, 154, 156, 158. The third bridge configuration further includes flux guides 162 and 164, which are positioned adjacent to the right edge of sensing elements 146 and 150, and flux guides 166 and 168, which are positioned adjacent to the left edge of sensing elements 144 and 148, respectively. Flux guides 166, 162, 168, and 164 are positioned below the sensing elements 144, 146, 148, and 150.

By positioning the first differential sensor 102 and the second differential sensor 122 to be orthogonally aligned, each with the sensing element orientations deflected equally from that sensors pinning direction and orthogonal to one another in each sensor, the sensors can detect the component directions of an applied field along the first axis (y axis) and second axis (x axis). Flux guides 162 and 166 are positioned in the differential sensor 142 below the opposite edges of the elements 146 and 144, in an asymmetrical manner between the leg 172 and the leg 170. The flux guide 162 of sensing element 146 guides the magnetic flux from the Z-field into the in-plane along the right side and causes the magnetization of sensing element 146 to rotate in a first direction towards a higher resistance. Similarly, the magnetic flux from the Z-field may be guided by the flux guide 166 into the in-plane along the left side of the sensing element 144 and cause the magnetization of sensing element 144 to rotate in a second direction, which is opposite from the first direction towards a lower resistance as this guide is antisymmetric to guide 162. Also, flux guides 164 and 168 are positioned in differential sensor 142 below the opposite edges of the elements 150 and 148, in an asymmetrical manner between the leg 176 and the leg 174. The flux guide 164 of sensing element 150 guides the magnetic flux from the Z-field into the in-plane along the right side and causes the magnetization of sensing element 150 to rotate in a first direction towards a higher resistance. Similarly, the magnetic flux from the Z-field may be guided by the flux guide 168 into the in-plane along the left side of the sensing element 148 and cause the magnetization of sensing element 148 to rotate in a second direction, which is opposite from the first direction towards a lower resistance as this guide is antisymmetric to guide 164. Thus, the differential sensor 142 can detect the component directions of an applied field along the third axis or the vertical axis (z axis).

Figure 2A:
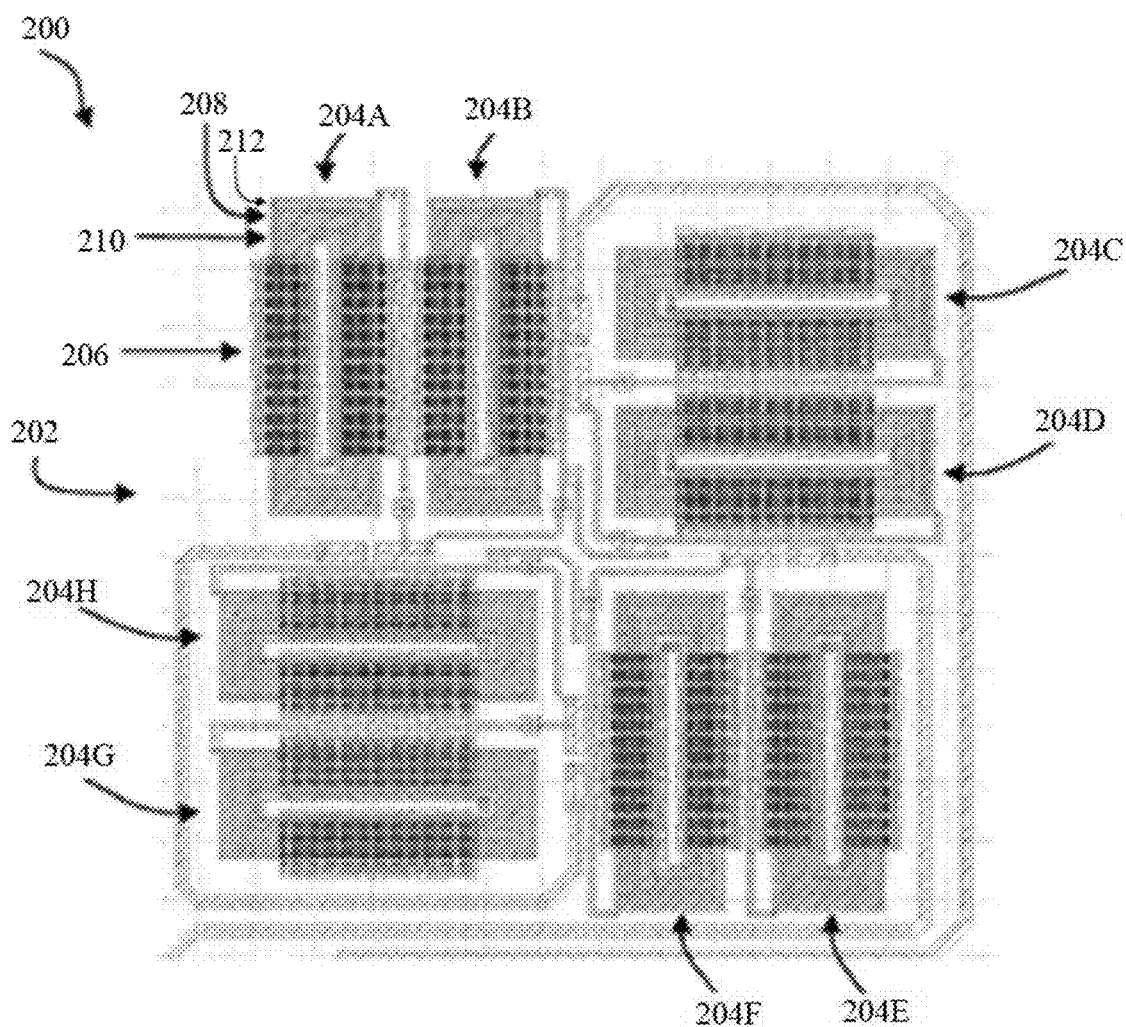
FIG. 2A is a diagram of a top view of a magnetic field sensor with an arrangement of sub-blocks that form a Z-sensor in which each sub-block includes a reset mechanism according to an example embodiment of this disclosure.
Figure 2B:
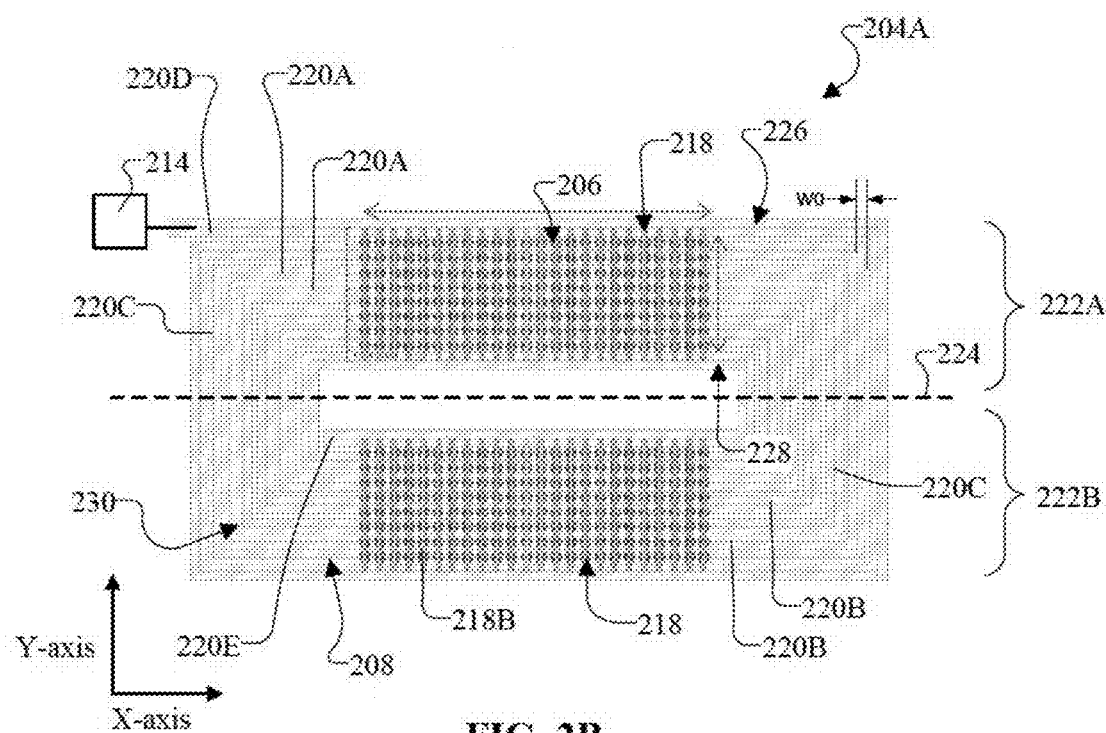
FIG. 2B is a diagram of a top view of a sub-block of FIG. 2A that shows the first coil in relation to the sensing elements and flux guides according to an example embodiment of this disclosure.
Figure 2C:
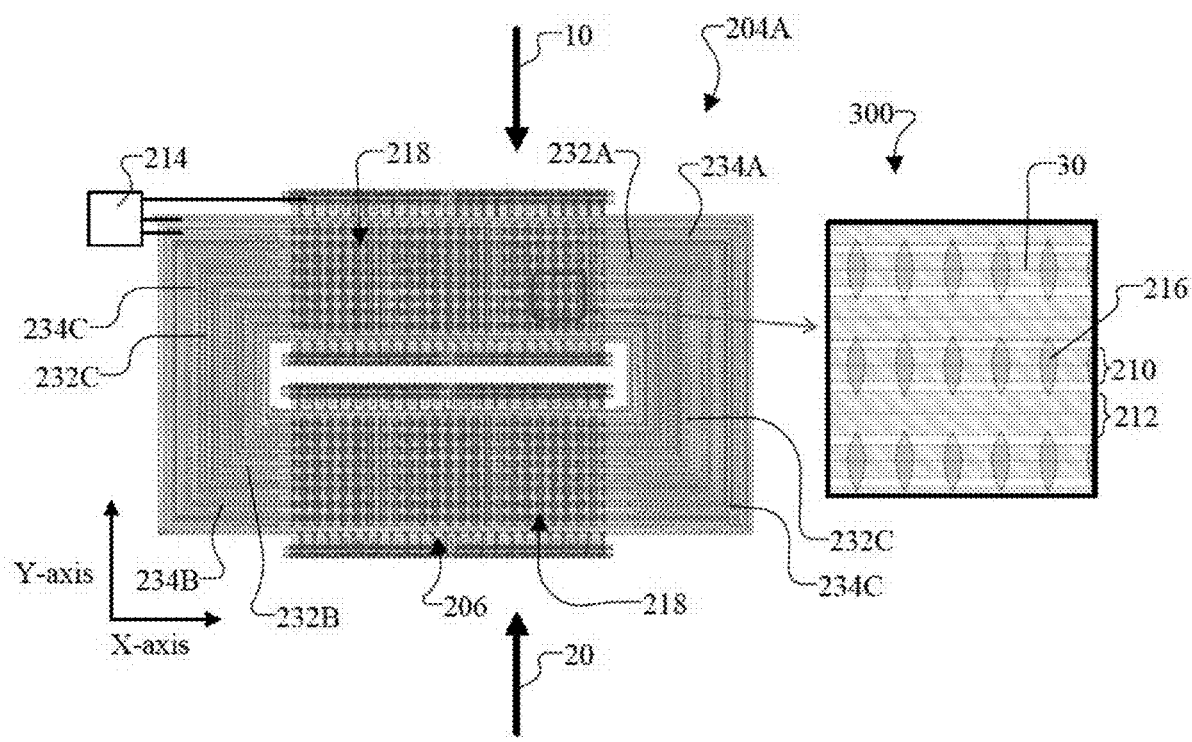
FIG. 2C is a diagram of a top view of a sub-block of FIG. 2A that shows the second coil and the third coil in relation to the sensing elements and flux guides according to an example embodiment of this disclosure.

FIGS. 2A, 2B, and 2C are diagrams of portions of a tunneling magnetoresistance (TMR) sensor device 200. The TMR sensor device 200 includes first, second, and third differential sensors configured to detect the component directions of an applied field along a first axis (y-axis), a second axis (x-axis), and a third axis (z-axis), respectively, similar to how the differential sensors 102, 122, 142 of FIG. 1 detect the component directions of an applied field. More specifically, FIG. 2A illustrates a planar view of a portion of the third differential sensor 202 (Z-sensor 202) of the TMR device 200. This Z-sensor 202 is configured to detect the component direction of the applied magnetic field along the third axis or the vertical axis (z-axis).

In the example shown in FIG. 2A, the Z-sensor 202 includes eight sub-blocks 204A~204H in which each one of the sub-blocks 204A~204H includes at least a sensor array 206 with sensing elements 216 (FIG. 2C), flux guides 218 (FIG. 2C), an independent flux guide reset coil 208, and an independent sensing element reset coil 210. In addition, each one of the sub-blocks 204A~204H is configured to include an independent reset assist coil 212. In some embodiments, the independent flux guide reset coil 208 and the independent sensing element reset coil 210 of each of the sub-blocks 204A~204H enable the sub-blocks 204A~204H to be reset independently from one another between read cycles of the Z-sensor 202. In other embodiments, the independent flux guide reset coil 208, the independent sensing element reset coil 210, and the independent reset assist coil 212 of each of the sub-blocks 204A~204H enable the sub-blocks 204A~204H to be reset independently from one another between read cycles of the Z-sensor 202. As an illustrative example, the flux guide reset coil 208, the sensing element reset coil 210, and the reset assist coil 212 of sub-block 204C enable the respective sensing elements 216 and flux guides 218 of sub-block 204C to be reset independently from the respective sensing elements 216 and flux guides 218 of the other sub-blocks 204A~204B and 204D~204H. In this regard, the sensing elements 216 and the flux guides 218 of sub-blocks 204A~204B and 204D~204H are not reset when the sensing elements 216 and the flux guides 218 of sub-block 204C are reset. As another illustrative example, the flux guide reset coil 208, the sensing element reset coil 210, and the reset assist coil 212 enable the respective sensing elements 216 and flux guides 218 of sub-blocks 204A, 204C, 204E, and 204H to be reset independently while the respective sensing elements 216 and flux guides 218 of sub-blocks 204B, 204D, 204F, and 204G are not reset.

The positional relationship among the sensor array 206, the flux guide reset coil 208, the sensing element reset coil 210, and the reset assist coil 212 of each one of the sub-blocks 204A~204H is generally similar from sub-block to sub-block and defines an orientation of the sub-block. As shown in FIG. 2A, the eight sub-blocks 204A~204H are laid out in horizontal and vertical orientations relative to one another. For example, sub-blocks 204A-204B and 204E-204F have vertical orientations relative to the viewing direction of the figure while sub-blocks 204C-204D and 204G-204H have horizontal orientations relative to the viewing direction of FIG. 2A. The different sub-block orientations mitigate the effects of stress and temperature on the performance of the Z-sensor 202 because these effects in the anisotropy directions are averaged together.

FIG. 2B shows the flux guide reset coil 208 superimposed over the sub-block 204A. FIG. 2B also shows the flux guide reset coil 208 relative to the sensor arrays 206. In this non-limiting example, the sensor array 206 includes a first region 222A and a second region 222B. The first region 222A includes three hundred eighty four sensing elements 216, whereby there are eight sensing elements 216 in each column along the y-axis and forty-eight sensing elements 216 in each row long the x-axis. The second region 222B includes three hundred eighty four sensing elements 216, whereby there are eight sensing elements 216 in each column along the y-axis and forty-eight sensing elements 216 in each row long the x-axis.

The flux guide reset coil 208 is arranged substantially in a plane such that both active portions of the flux guide reset coil 208 and inactive portions of the flux guide reset coil 208 extend along a single plane within the sub-block 204A. The active portions of the flux guide reset coil 208 are configured to exert a first reset field (e.g. magnetic field) on the sensor array 206. The inactive portions of flux guide reset coil 208 connect the active portions of the flux guide reset coil 208 to one another. The flux guide reset coil 208 is positioned below the sensor array 206 in the embodiment shown in FIG. 2A. In other embodiments, the flux guide reset coil 208 can be positioned above the sensor array 206.

The flux guide reset coil 208 has a plurality of parallel segments 220A and 220B routed past the sensor array 206. The parallel segments 220A and 220B are oriented orthogonal to the flux guides 218 so as to generate a first reset field along the preferred magnetization direction of the flux guides 218 when the flux guide reset coil 208 is energized. The parallel segments 220A and 220B are routed past the sensor array 206 in that each of the parallel segments 220A and 220B extend along their length proximate to the flux guides 218 of the sensor array 206 such that the first reset field (in combination with the second reset field and third reset field described in connection with FIG. 2C) can orient the magnetization of the flux guides 218 to the preferred magnetization direction. In some embodiments, the parallel segments 220A and 220B pass directly above or directly below the flux guides 218 when viewed in a direction perpendicular to the plane in which the flux guide reset coil 208 is arranged.

The flux guides 218 of each sensor array 206 further include a first set of flux guides 218 arranged in a first region 222A of the sensor array 206 and a second set of flux guides 218 arranged in a second region 222B of the sensor array 206. In some embodiments, the first region 222A and the second region 222B are disposed symmetrically about a plane 224. The first set of flux guides 218 and the second set of flux guides 218 have a respective first predetermined magnetization direction 10 (FIG. 2C) and a second predetermined magnetization direction 20 (FIG. 2C) that are opposite to one another. The sensing elements 216 of the sensor array 206 in some embodiments may include a sensor array 206 with a different bit array configuration, such as a 72×8×2 bit array or any suitable arrangement. The parallel segments 220A of the flux guide reset coil 208 are routed orthogonally past the first set of flux guides 218 in the first region 222A The parallel segments 220B of the flux guide reset coil 208 are routed orthogonally past the second set of flux guides 218 in the second region 222B.

Accordingly, the flux guide magnetization orientations of each of the sub-blocks 204A~204H are divided into an upper half and a lower half with opposing orientations after a flux guide reset operation is executed. This configuration allows an internal compensation within the sensing transducer for any process induced asymmetries that result in stray in-plane fields emanating from the flux guides and acting on the sensing elements themselves. Such stray fields will act in opposite directions on the top and bottom half of the sensor bridge and their electrical influence on sensing element resistance is eliminated via the bridge interconnect wiring which averages resistances of sensing elements in top and bottom halves of one of the sub-blocks 204A~204H together.

The flux guide reset coil 208 also has a plurality of further segments 220C that connect the first segments 220A and the second segments 220B to one another. These further segments 220C provide the coil routing between the first segments 220A and the second segments 220B. In FIG. 2B, the further segments 220C in the embodiment shown are routed past portions of the sub-block 204A that are not occupied by the sensor array 206. In some embodiments, the further segments 220C in these portions of the sub-block 204A are strapped to other metal layers of the substrate so as to reduce a resistance of the flux guide reset coil 208. The further segments 220C in some embodiments have a width (W0) that is wider or different than a width (e.g., W1 or W2) of the parallel segments 220A and 220B so as to optimize parasitics and performance. In yet further embodiments, the sensing elements 216 and the flux guides 218 are also placed in regions proximate to the further segments 220C and contribute to the sensing area of the Z sensor 202 and further lower the overall system noise.

The flux guide reset coil 208 in the embodiment depicted in FIG. 2B is a planar rectangular coil that has an outermost coil portion 226, an innermost coil portion 228, and a plurality of interior turns 230 disposed between the outermost coil portion 226 and the innermost coil portion 228. In the example shown in FIG. 2B, the flux guide reset coil 208 has a start segment 220D that extends linearly for a long-side length along the x-axis, then a first coil segment that is oriented 90 degrees from the start segment and extends linearly for a short-side length along the y-axis, and then a second coil segment that is oriented 90 degrees from the first coil segment and extends linearly for another long-side length along the x-axis. This pattern continues with the long-side lengths and short-side lengths getting shorter after each successive turn about a winding axis to define the rectangular coil.

In FIG. 2B, the flux guide reset coil 208 has a finish segment 220E that is closer to the winding axis than the start segment 220D. The start segment 220D and at least one immediately succeeding coil segment define the outermost coil portion 226 of the flux guide reset coil 208. The finish segment 220E and at least one immediately preceding coil segment define the innermost coil portion 228 of the flux guide reset coil 208.

FIG. 2C shows the sensing element reset coil 210 and the reset assist coil 212 with respect to the sensor array 206 for the sub-block 204A of FIG. 2B. As shown in FIG. 2C, the sensing element reset coil 210 and the reset assist coil 212 are provided as a separate layer from the flux guide reset coil 208. More specifically, the sensing element reset coil 210 is arranged substantially in a plane that is spaced apart from the plane in which the flux guide reset coil 208 is arranged. The sensing element reset coil 210 is electrically insulated from flux guide reset coil 208. The sensing element reset coil 210 is positioned relative to the sensor array 206 to be able to perform the sensing element reset operation while also being positioned to provide an effective contribution to the total reset field during the flux guide reset operation. The sensing element reset coil 210 is positioned above the sensor array 206 in the embodiment shown in FIG. 2C. In another embodiment, the sensing element reset coil 210 can be positioned below the sensor array 206 in which case the flux guide reset coil 208 would typically be positioned above the sensor array 206.

The sensing element reset coil 210 has a plurality of parallel segments 232A and 232B routed past the sensor array 206. The parallel segments 232A and 232B are oriented orthogonal to the flux guides 218 so as to generate a second reset field along the preferred magnetization direction of the flux guides 218 when the sensing element reset coil 210 is energized during the flux guide reset operation. Additionally, a center axis 30 of each of the parallel segments 232A and 232B is aligned centrally with a respective row of the sensing elements 216 in the sensor array 206 along the x-axis so that the second reset field eliminates magnetic domains and reduces the Barkhausen noise in the sensing elements 216 during the sensing element reset operation. The sensing element reset coil 210 also has further segments 232C that connect the parallel segments 232A and 232B to one another. The further segments 232C are routed past portions of the sub-block 204A that are not occupied by the sensor arrays 206. The sensing element reset coil 210 in the embodiment depicted in FIG. 2C is a planar rectangular coil. In some embodiments, the sensing element reset coil 210 has an outermost coil portion, an innermost coil portion, and a plurality of interior turns that form a rectangular coil in a manner similar to the flux guide reset coil 208 described with reference to FIG. 2B. As shown in FIG. 2C, the sensing element reset coil 210 is a rectangular coil that has long lengths along the x-axis and short lengths along the y-axis.

The Z-sensor 202 may include the reset assist coil 212. The reset assist coil 212 is arranged substantially in the plane in which the sensing element reset coil 210 is arranged. The reset assist coil 212 is configured to create additional field uniformity between the locally strong fields centered on the sensing elements 216. The reset assist coil 212 also operates to assist during the flux guide reset operation.

The reset assist coil 212 has a plurality of parallel segments 234A and 234B routed past the sensor array 206. The parallel segments 234A and 234B are oriented orthogonal to the flux guides 218 so as to generate a third reset field along the preferred magnetization direction of the flux guides 218 when the reset assist coil 212 is energized during the flux guide reset operation. In addition, the reset assist coil 212 also has further segments 234C that connect the parallel segments 234A and 234B to one another. The further segments 234C are routed past portions of the sub-block 204A that are not occupied by the sensor array 206. The reset assist coil 212 in the embodiment depicted in FIG. 2C is a planar coil, which includes an outermost coil portion, an innermost coil portion, and a plurality of interior turns to form a rectangular coil in a manner similar to the flux guide reset coil 208 described with reference to FIG. 2B. As shown in FIG. 2C, the reset assist coil 212 is a rectangular coil that has long lengths along the x-axis and short lengths along the y-axis.

The Z-sensor 202 further includes circuitry 214, which is operatively connected to the flux guide reset coil 208 and the sensing element reset coil 210, respectively. In addition, this circuitry 214 is operatively connected to the reset assist coil 212. This circuitry 214, is conceptually represented in FIGS. 2B and 2C. The circuitry 214 includes structures, devices, or technology configured to control and provide electrical connections for one or more conductive elements for which the circuitry 214 is operatively associated or connected. For example, the circuitry 214 of the Z-sensor 202 is specifically configured to execute the sensing element reset operation and the flux guide reset operation independently from one another within each one of the sub-blocks 204A-204H and independently among the different sub-blocks 204A-204H.

To carry out the sensing element reset operation, the circuitry 214 is configured to energize only the sensing element reset coil 210 to generate the second reset field such that the total reset field only comprises the second reset field. The circuitry 214 is configured to energize at least the active segments (e.g., parallel segments 220A and 220B) of the sensing element reset coil 210 and/or the entire sensing element reset coil 210 during the sensing element reset operation. The circuitry 214 does not energize the flux guide reset coil 208 and/or the reset assist coil 212 during this sensing element reset operation. Upon being energized, the sensing element reset coil 210 is configured to generate the second reset field to orient a magnetization of sensing elements 216 to a predetermined state without changing the magnetization of the flux guides 218. The second reset field by itself is sufficient to eliminate magnetic domains and reduce the Barkhausen noise in the sensing elements 216 without changing the preferred magnetization direction of the flux guides 218. In this regard, the sensing element reset coil 210 is optimized for high peak field to minimize the currents required during the sensing element reset operation.

To carry out the flux guide reset operation, in some embodiments, the circuitry 214 is configured to energize both the flux guide reset coil 208 and the sensing element reset coil 210 to generate the first reset field about the flux guide reset coil 208 and the second reset field about the sensing element reset coil 210, respectively. The circuitry 214 is configured to energize at least the active segments (e.g., parallel segments 220A and 220B) of the flux guide reset coil 208 and the active segments (e.g., parallel segments 232A and 232B) of the sensing element reset coil 210. The circuitry 214 is configured to energize the entire flux guide reset coil 208 and the entire sensing element reset coil 210. The first and second reset fields combine to establish a total reset field sufficient to orient the magnetization directions of the flux guides 218 into a known, previously-calibrated state, which can be interchangeably referred to as the predetermined magnetization direction/orientation of the flux guides or the predetermined flux guide magnetization direction/orientation. In this regard, the flux guide reset coil 208 is optimized for low resistance and field uniformity.

Also, in other embodiments for carrying out the flux guide reset operation, the circuitry 214 is configured to energize the flux guide reset coil 208, the sensing element reset coil 210, and the reset assist coil 212, respectively. In this regard, the circuitry 214 is configured to energize at least the active segments (e.g. parallel segments 220A and 220B) of the flux guide reset coil 208, the active segments (e.g. parallel segments 232A and 232B) of the sensing element reset coil 210, and the active segments (e.g., parallel segments 234A and 234B) of the reset assist coil 212. The circuitry 214 is configured to energize the entire flux guide reset coil 208, the entire sensing element reset coil 210, and the entire reset assist coil 212. When energized, the reset assist coil 212 is configured to generate a third reset field about the reset assist coil 212. The third reset field is configured to smooth the first reset field about one or more flux guides 218, which facilitates in orienting the magnetization directions of the flux guides 218 during the flux guide reset operation. With this configuration, the circuitry 214 is configured to activate the flux guide reset coil 208, the sensing element reset coil 210, and the reset assist coil 212 to generate first, second, and third reset fields, which combine to establish a total reset field sufficient to orient the magnetization of the flux guides 218 into a known, previously-calibrated state.

Figure 3:
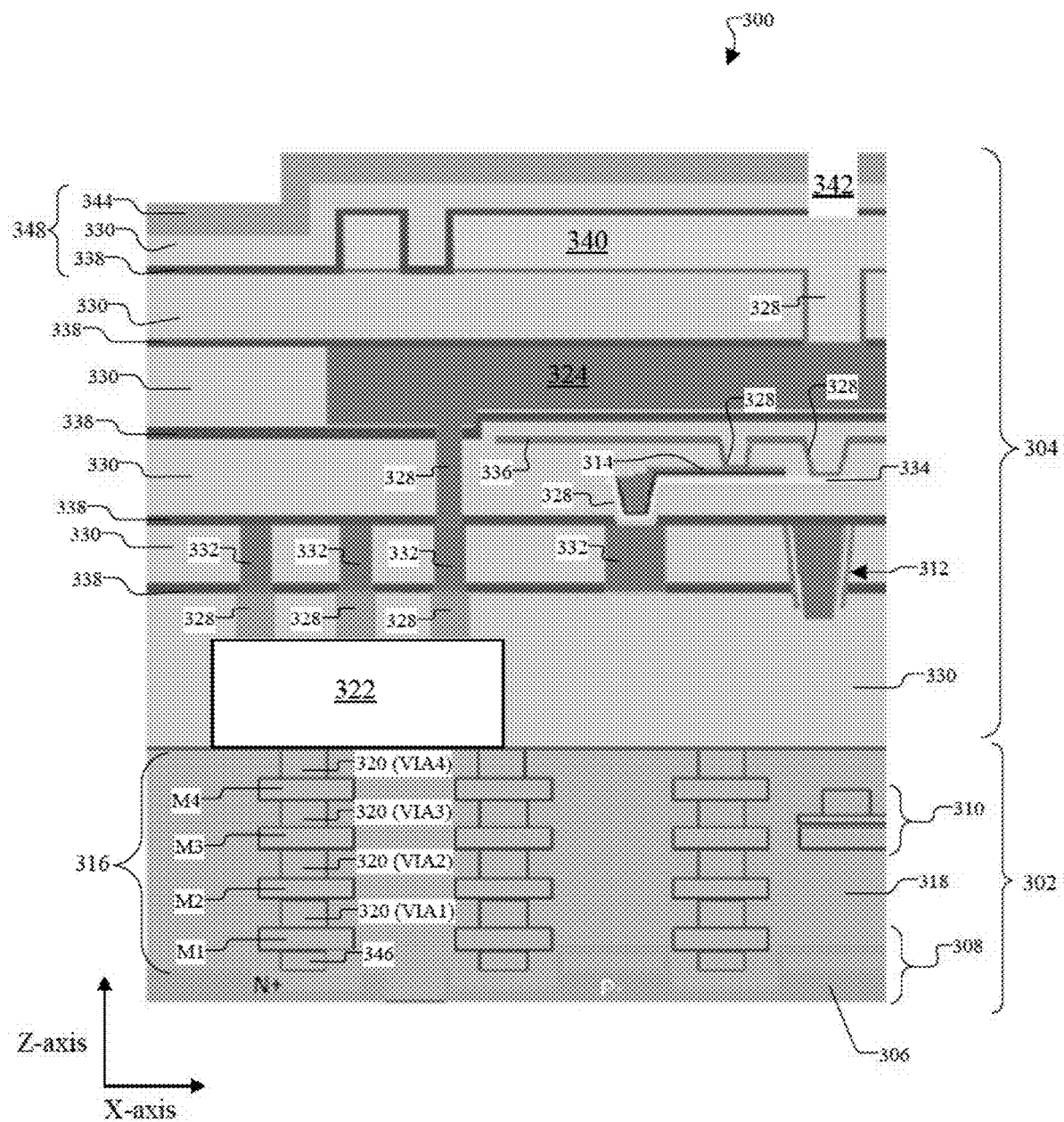
FIG. 3 is a diagram of a cross-sectional view of a part of the sensor structure according to an example embodiment of this disclosure.

FIG. 3 is a view of a cross-section that shows a part of a sensor structure 300 according to an example embodiment. The sensor structure 300 integrates transistor technology with magnetoresistance technology, such as TMR technology, on a single chip. In FIG. 3, for instance, the sensor structure 300 includes a transistor assembly 302 and a magnetoresistive sensor assembly 304 arranged in a stack with respect to a substrate 306. The transistor assembly 302 and the magnetoresistive sensor assembly 304 are operably connected to each other.

The transistor assembly 302 includes at least the circuitry 214, which is configured to activate a flux guide reset mechanism of the magnetoresistive sensor assembly 304 to establish a total reset field sufficient to orient the magnetization of at least one flux guide 312 into a known, previously-calibrated state. In addition, the transistor assembly 302 includes the circuitry 214, which is configured to activate a sensing element reset circuitry of the magnetoresistive sensor assembly 304 to establish a reset field sufficient to reset one or more sensing elements 314. For example, in FIG. 3, the circuitry 214 includes at least a complementary metal-oxide-semiconductor (CMOS) device 308. The sensor structure 300 may also include a metal-insulator-metal (MIM) device 310, which may be a part of the circuitry 214 or a part of a signal amplification circuitry for the sensor structure. The CMOS device 308 includes at least standard CMOS components. The compatibility of the TMR technology with the CMOS device 308 provides for enhanced sensitivity with a relatively large linear sensing regime and relative low noise. Also, the transistor assembly 302 and/or CMOS device 308 includes one or more metal layers 316. As a non-limiting example, FIG. 3 illustrates a transistor assembly 302 and/or CMOS device 308, which includes at least a first metal layer M1, a second metal layer M2, a third metal layer M3, and a fourth metal layer M4. Each metal layer 316 is insulated within an insulating portion 318, which includes one or more insulating layers as shown in at least FIG. 3. The insulating portion 318 also insulates a contact 346 and vertical interconnects 320 (or vias 320), which operably connect one or more of the metal layers 316 and the CMOS device 308 to each other. The contact 346 provides an electrical connection between the substrate 306, which comprises a semiconductor (e.g., silicon), and the first metal layer M1. The plurality of vertical interconnects 320 includes any suitable number of vertical interconnects 320. For example, in FIG. 3, the plurality of vertical interconnects 320 includes at least a first vertical interconnect VIA1, a second vertical interconnect VIA2, a third vertical interconnect VIA3, and a fourth vertical interconnect VIA4. Referring to FIG. 3, as an example, the upper metal layer (e.g., fourth metal layer M4) is configured to connect to the magnetoresistive sensor assembly 304 via the upper vertical interconnect 320 (e.g. VIA4). In addition, within the insulating portion 318, the transistor assembly 302 includes the MIM device 310 in the vicinity of at least one of the metal layers 316. In FIG. 3, for instance, the MIM device 310 is a capacitor top metal (CTM) device disposed in the insulating portion 318 between the third metal layer M3 and the fourth metal layer M4. In this regard, the MIM device 310 is operably connected to the CMOS device 308 via the metal layers 316 and the vertical interconnects 320.

The magnetoresistive sensor assembly 304 includes at least the TMR device, which is configured as the Z-sensor 202. For example, FIG. 3 illustrates a conceptual diagram of a cross-sectional view of a portion of the TMR device, which includes a view of at least one sensing element 314, which corresponds to at least one of the sensing elements 216 of the sensor array 206 of FIG. 2C. The TMR device is configured to detect the component direction of the applied magnetic field along the third axis or z-axis direction. In addition, the TMR device includes the flux guide 312 and a flux guide reset mechanism. The flux guide reset mechanism includes at least a first reset component and a second reset component. In addition, the flux guide reset mechanism may include at least one other reset component, such as a third reset component, which is disposed within the same dielectric as the second reset component and not viewable in the cross-section shown in FIG. 3.

The first reset component includes at least an ultra-thick metal (UTM) coil as a first coil 322, which is configured as the flux guide reset coil 208 (FIG. 2A) and which is structured as a coil comprising any suitable coil shape and configuration. As a non-limiting example, in FIG. 2A, the flux guide reset coil 208 comprises a rectangular coil configuration with respect to a top, planar view. The second reset component includes at least a section of a metal global interconnect (MGI) element as a second coil 324, which is configured as the sensing element reset coil 210 (FIG. 2C) and which is structured as a coil comprising any suitable coil shape and configuration. As a non-limiting example, in FIG. 2A, the sensing element reset coil 210 comprises a rectangular coil configuration with respect to a top, planar view. Furthermore, although not shown in this cross-sectional view, the third reset component includes an MGI assist element as a third reset coil 326, which is configured as the reset assist coil 212 (FIG. 2C) and which is structured as coil comprising any suitable coil shape and configuration. As a non-limiting example, in FIG. 2C, the reset assist coil 212 comprises a rectangular coil configuration with respect to a top, planar view. As shown in at least FIG. 3, the flux guide 312 is disposed between a dielectric layer 330 that contains the first reset component (e.g., first coil 322) and another dielectric layer 330 that contains the second reset component (e.g., second coil 324) or both the second reset component (e.g., second coil 324) and the third reset component (e.g., third coil 326). Also, in this example, the flux guide 312 is configured to penetrate into the dielectric layer 330 that contains at least the first reset component (e.g. first coil 322). As a non-limiting example, the dielectric layer 330 comprises tetraethoxysilane (TEOS), any suitable dielectric material, or any combination thereof.

In response to communications with the transistor assembly 302, the flux guide reset mechanism is configured to carry out a reset operation to orient the magnetization of flux guide 312 to a predetermined magnetic orientation or a default setting. More specifically, the flux guide reset mechanism is advantageously configured to perform the reset operation with voltage that is suitable for a variety of applications including, for example, mobile and smart phone applications.

In addition, the magnetoresistive sensor assembly 304 includes vertical interconnects 328 that are disposed within a dielectric layer 330, which is disposed on the first coil 322. The vertical interconnects 328 operably connect the first coil 322 to a metal line 332. In FIG. 3, the metal line 332 may comprise copper, aluminum, or any suitable metal. The metal line 232 is connected to a magnetic tunnel junction (MTJ) element by means of the vertical interconnect 328. The MTJ element includes a magnetic reference element 334 (or pinning element) and the sensing element 314. The sensing element 314 provides a change in resistance in response to a field. The MTJ element is connected to a local interconnect 336 by means of vertical interconnect 328. In addition, the second coil 324 is connected to the metal line 332 by means of vertical interconnect 328. The second coil 324 may connect to a thick metal pad finishing 340. In this example, the thick metal pad finishing 340 comprises aluminum, any suitable metal, or any suitable combination thereof. Furthermore, the sensor structure 300 includes a number of dielectric layers 330 between the various components, as shown in FIG. 3. In addition, depending on the materials (e.g., metals such as copper) that are used, the sensor structure 300 may include a number of etch stop layers 338 of suitable thicknesses between these various components, as shown in FIG. 3. As a non-limiting example, the etch stop layer 338 comprises silicon nitride (SiN), any suitable etch stop material, or any combination thereof. The magnetoresistive sensor assembly 304 further includes a passivation layer 348, which is configured to protect the chip. In this example, the passivation layer 348 comprises at least one dielectric layer 330, at least one silicon nitride layer 338, and at least one silicon oxynitride (SiON) layer 344. The passivation layer 348 includes at least one opening 342 that exposes the thick metal pad finishing 340 for electrical access thereto.

Figure 4A:
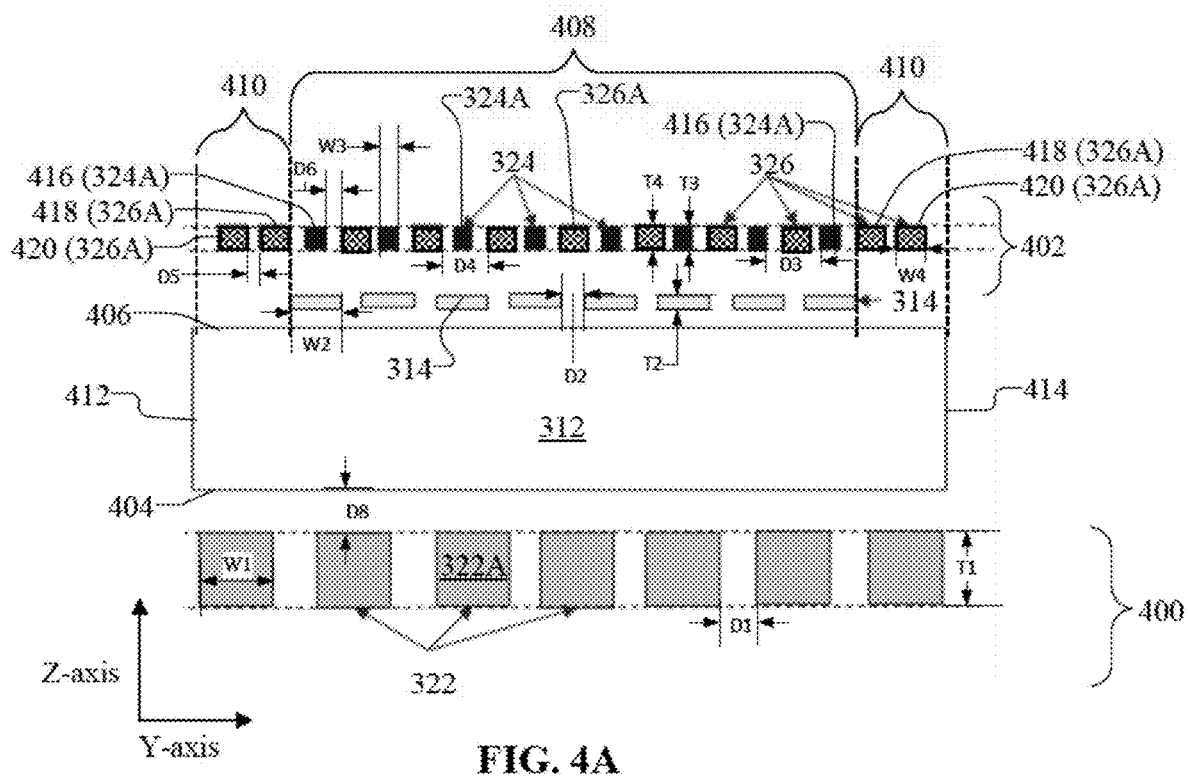
FIG. 4A is a conceptual diagram of a cross-sectional view of a first example of a flux guide reset mechanism in relation to sensing elements and a flux guide according to an example embodiment of this disclosure.
Figure 4B:
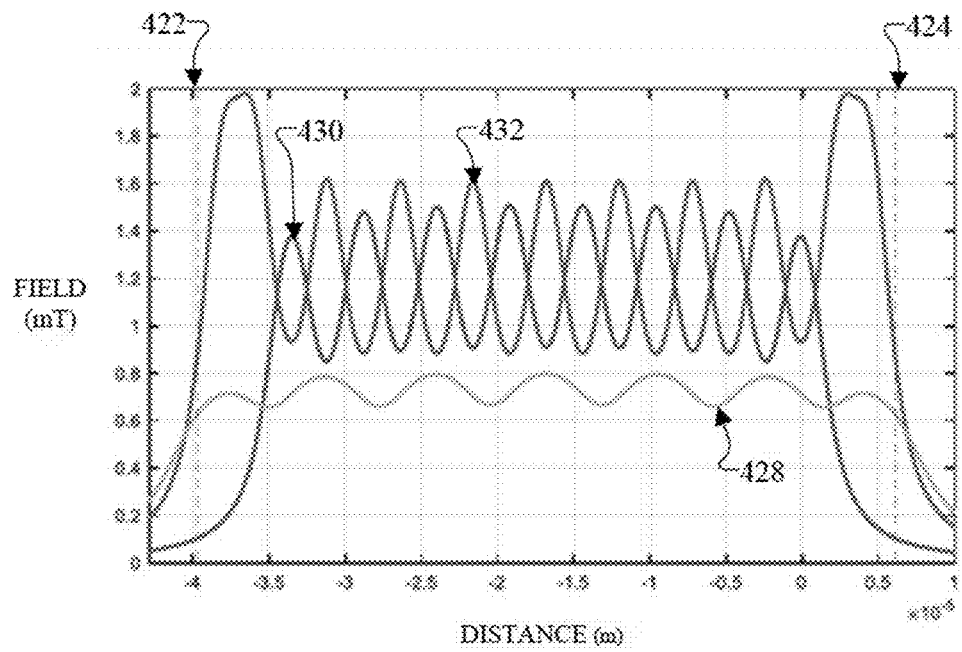
FIG. 4B is a diagram of a graph that illustrates in-plane components of magnetic field densities with respect to distance along the flux guide for the flux guide reset mechanism of FIG. 4A according to an example embodiment of this disclosure.
Figure 4C:
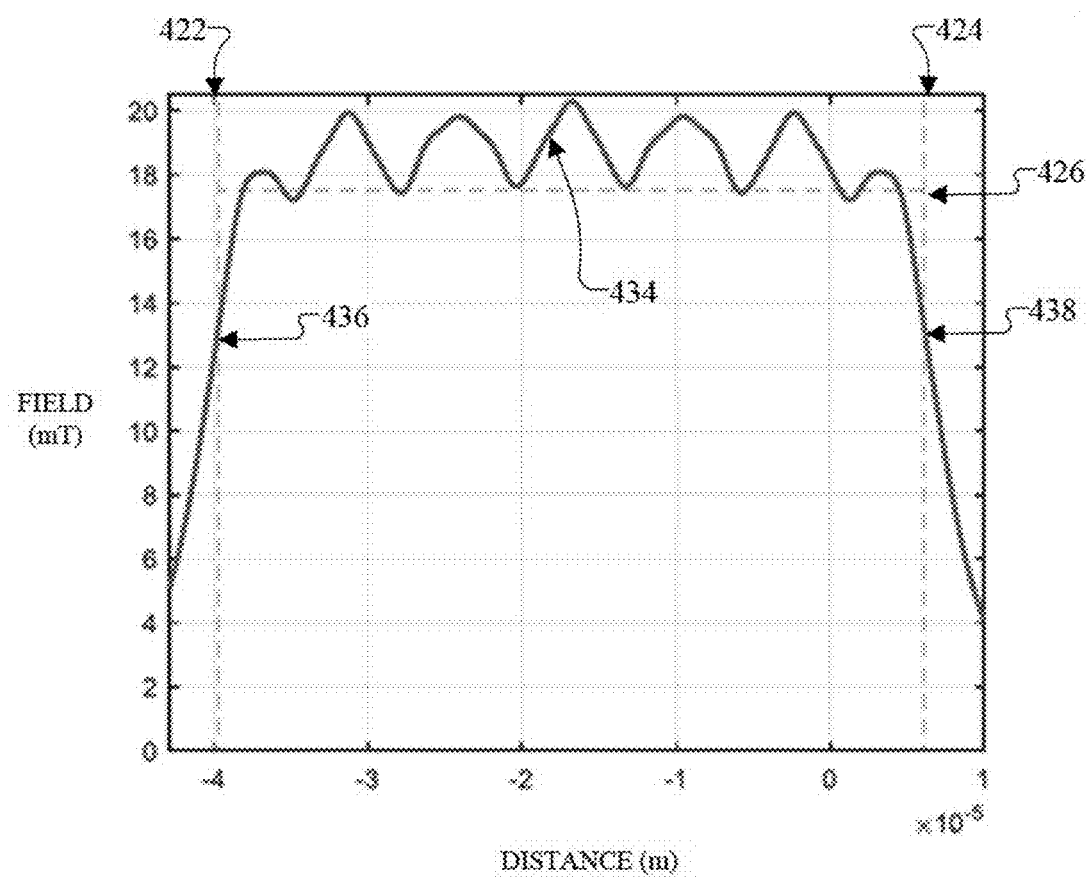
FIG. 4C is a diagram of a graph that illustrates an in-plane component of a total magnetic field density with respect to distance along the flux guide for the flux guide reset mechanism of FIG. 4A according to an example embodiment of this disclosure.

FIGS. 4A, 4B, and 4C are conceptual diagrams that provide a general overview of a configuration of the magnetoresistive sensor assembly 304. More specifically, FIG. 4A is a conceptual diagram that shows a cross-sectional view of a selection of parts of the magnetoresistive sensor assembly 304 that relate to the graphical data of FIGS. 4B and 4C. FIG. 4A is a cross-section taken along the yz-plane corresponding to the y-axis and the z-axis.

In FIG. 4A, the magnetoresistive sensor assembly 304 is shown with sensing elements 314, which are disposed in a dielectric layer 330 over the flux guide 312. The flux guide 312 is configured to guide magnetic flux to the sensing elements 314. The flux guide 312 is located adjacent to the sensing element 314. In addition, the magnetoresistive sensor assembly 304 includes the flux guide reset mechanism, which is configured to set the flux guide 312 to the predetermined magnetic orientation. The flux guide reset mechanism includes a first section 400 and a second section 402. The flux guide 312 and the sensing elements 314 are both disposed between the first section 400 and the second section 402.

The first section 400 is disposed on a first side 404 of the flux guide. The first section 400 is disposed on a first side of the sensing elements 314. The first section 400 includes the first coil 322, which is configured as the flux guide reset coil 208. The first coil 322 includes a plurality of first coil segments 322A. The first coil 322 is disposed within at least one dielectric layer 330. As shown in FIG. 3, the dielectric layer 330 is configured to insulate portions of the first coil 322. In addition, FIG. 4A shows cross-sections of the first coil segments 322A, which have lengths that extend perpendicular to a length of the flux guide 312. Each of the first coil segments 322A has a width W1 and a thickness T1. Also, as shown in FIG. 4A, there is a distance D1 (e.g., spacing or dielectric) between adjacent first coil segments 322A. The first coil 322 is enabled to provide this layout of first coil segments 322A relative to the flux guide by having relatively low resistivity. For example, in FIG. 4A, the first coil segments 322A comprise at least aluminum or any suitable material that is enabled to provide similar results as discussed herein.

The second section 402 is disposed on a second side 406 of the flux guide 312. The second section 402 is disposed on a second side of the sensing elements 314. Each sensing element 314 has a width W2 and a thickness T2. Also, there is a distance D2 between adjacent sensing elements 314. As shown in FIG. 4A, a dimension of the flux guide 312 is greater than a dimension of the set of sensing elements 314 along the y-axis such that the end portions of the flux guide 312 are not overlapped by the sensing elements 314. This feature ensures that each of the sensing elements 314 is more than fully covered by the flux guide 312, thereby ensuring that magnetic flux is guided to the sensing elements 314 at least by an inner region 408 with an extra margin provided by an outer region 410.

The second section 402 includes the second coil 324 and the third coil 326. FIG. 4A shows cross-sections of second coil segments 324A and cross-sections of third coil segments 326A, which have lengths that extend parallel to each other and perpendicular to a length of the flux guide 312. Each second coil segment 324A has a width W3 and a thickness T3. In addition, each third coil segment 326A has a width W4 and a thickness T4. Also, the thickness T3 of the second coil segment 324A is the same or substantially the same as the thickness T4 of the third coil segment 326A. Also, in this example, the second coil segments 324A are in the same layer as the third coil segments 326A. In this example, the dimensions (e.g., W1 and T1) of each first coil segment 322A are greater than the dimensions (e.g., W3 and T3) of each second coil segment 324A. Also, in this example, the dimensions (e.g., W1 and T1) of each first coil segment 322A are greater than the dimensions (e.g., W4 and T4) of each third coil segment 326A. In this example, the pitch (W1+D1) of the first coil segments 322A is not the same as the pitch (W2+D2) of the second coil segments 324A.

Also, as shown in FIG. 4A, there is a distance D3 between neighboring second coil segments 324A. In addition, there is a distance D4 between neighboring third coil segments 326A within an inner region 408 while there is a distance D5 between adjacent third coil segments 326A within an outer region 410. There is a distance D6 between (i) the second coil segment 324A and the third coil segment 326A that are adjacent to each other, or (ii) the third coil segment 326A and the second coil segment 324A that are adjacent to each other. Each of the distances ensure that there is an adequate amount of at least one dielectric layer 330 between any pair of adjacent coil segments. Also, in this example, the distance D4 is greater than the distance D5, as the neighboring third coil segments 326A in the inner region 408 include a second coil segment 324A interleaved between the neighboring third coil segments 326A. Meanwhile, in this example, the distance D5 is similar or substantially similar in length to the distance D6.

In addition, there is the inner region 408 and the outer region 410, which are associated with the flux guide 312. The inner region 408 corresponds to portions overlapping the sensing elements 314. The inner region 408 may be defined at least by an end surface of a first sensing element 314 and an end surface of a last sensing element 314. The first sensing element 314 and the last sensing element 314 are a part of a set of sensing elements 314, which are aligned along an axis parallel to the y-axis. In this regard, the inner region 408 of the second section 402 overlaps a corresponding inner region 408 of the flux guide 312. The inner region 408 of the flux guide 312 includes a center portion of the flux guide 312.

The inner region 408 has a layout that includes third coil segments 326A, which are interleaved with the second coil segments 324A such that these two coils are arranged in an alternating pattern, as shown in FIG. 4A. In this inner region 408, each second coil segment 324A is associated with and aligned with a corresponding one of the sensing elements 314. As aforementioned, the center axis 30 of each second coil segment 324A is aligned with a center part of a corresponding sensing element 314. This correspondence provides at least a one-to-one relationship between the second coil segments 324A and the sensing elements 314. The second coil 324 is configured to be energized sequentially in sections during a sensing element reset operation and configured to be energized all at once in conjunction with the other coils during a flux guide reset operation. This feature is advantageous as the second coil 324 or portions thereof are configured to provide a sensing element reset function when activated as the sensing element reset circuitry while also being configured to provide a flux guide reset function when activated as the flux guide reset mechanism.

The outer region 410 extends from the inner region 408 towards the edges 412 and 414 of the flux guide 312. The outer region 410 of the flux guide 312 includes edges 412 and 414 of the flux guide 312, as shown in FIG. 4A. The outer region 410 of the second section 402 corresponds to portions about the flux guide 312 that do not overlap the sensing elements 314. The outer region 410 may be defined from ends of sensing elements 314 of a column of the sensor array 206 towards edges of the flux guide 312. The outer region 410 has a layout that includes third coil segments 326A, which are disposed adjacent to each other. For example, in FIG. 4A, the outer region 410 includes two loops of the third coil 326 on outer sides of the outermost segments 416 of the second coil segments 324A. In this example, the outer region 410 is configured with a set of third coil segments 326A. As shown in FIG. 4A, this set includes innermost segments 418 and adjacent segments 420.

FIGS. 4B and 4C show an in-plane component (y-axis component) of magnetic field profiles, which are sampled at a center region of the flux guide 312. In general, the graphs (FIGS. 4B-4C, 5B-5C, 6B-6C, 7B-7C, and 8B) illustrate the relations between magnetic flux density values in millitesla (mT) or tesla (T) along the y-axis with respect to distances along the flux guide 312 in meters (m) along the x-axis. In these non-limiting examples, the reference value of zero that serves as a basis for the calculation of distances is taken at a position along the flux guide 312 that corresponds to a center of the rightmost turn of the second coil 324. The graphs also include a first reference line 422 to indicate a location of the left edge 412 of the flux guide 312 and a second reference line 424 to indicate a location of the right edge 414 of the flux guide 312. In addition, some graphs (FIGS. 4C and 5C) include a third reference line 426 to indicate a threshold (e.g., a magnetic flux density value) in which the flux guide reset operation performs adequately.

FIG. 4B illustrates a magnetic field profile 428 of the first coil 322, a magnetic field profile 430 of the second coil 324, and a magnetic field profile 432 of the third coil 326, respectively, when driven by 10 mA currents and when sampled at a center region of the flux guide 312. In this regard, the configuration of FIG. 4A requires relatively high currents to provide a total magnetic field profile 434 that satisfies a threshold (e.g., 17.5 mT), as indicated by reference line 426 (FIG. 4C), for performing the flux guide reset operation. For instance, in FIGS. 4B and 4C, the first coil 322 is supplied with 170 mA, the second coil 324 is supplied with 27 mA, and the third coil 326 is supplied with 26 mA. As shown in FIGS. 4B and 4C, there is some wasted energy that results from the variance of the total magnetic field profile 434 with respect to the threshold indicated at reference line 426. In addition, as shown in FIG. 4C, the total magnetic field profile 434 has a magnetic flux density value 436 and a magnetic flux density value 438 at the edges 412 and 414 that are substantially lower than the threshold, thereby resulting in the flux guide reset operation being less effective at the outer region 410 of the flux guide 312 compared to the inner region 408 of the flux guide 312.

Figure 5A:
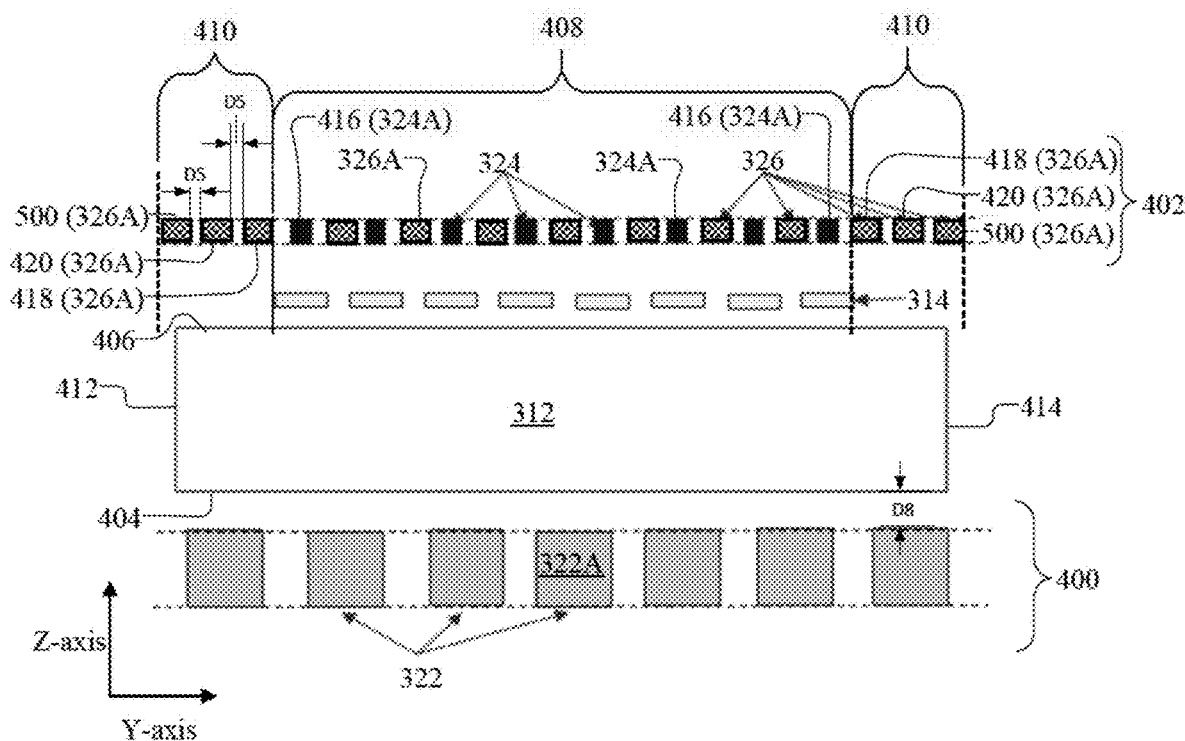
FIG. 5A is a conceptual diagram of a cross-sectional view of a second example of a flux guide reset mechanism in relation to sensing elements and a flux guide according to an example embodiment of this disclosure.
Figure 5B:
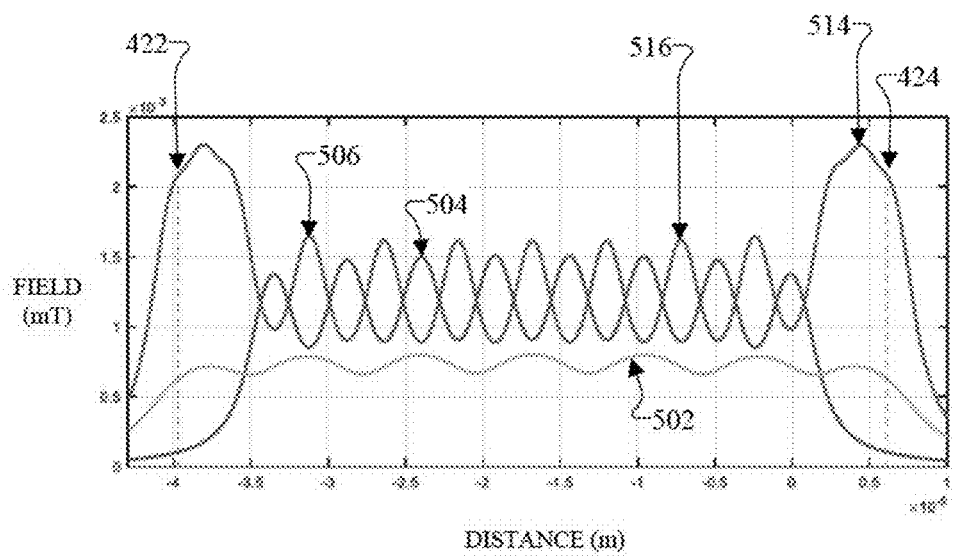
FIG. 5B is a diagram of a graph that illustrates in-plane components of the magnetic field densities with respect to distance along the flux guide for the flux guide reset mechanism of FIG. 5A according to an example embodiment of this disclosure.
Figure 5C:
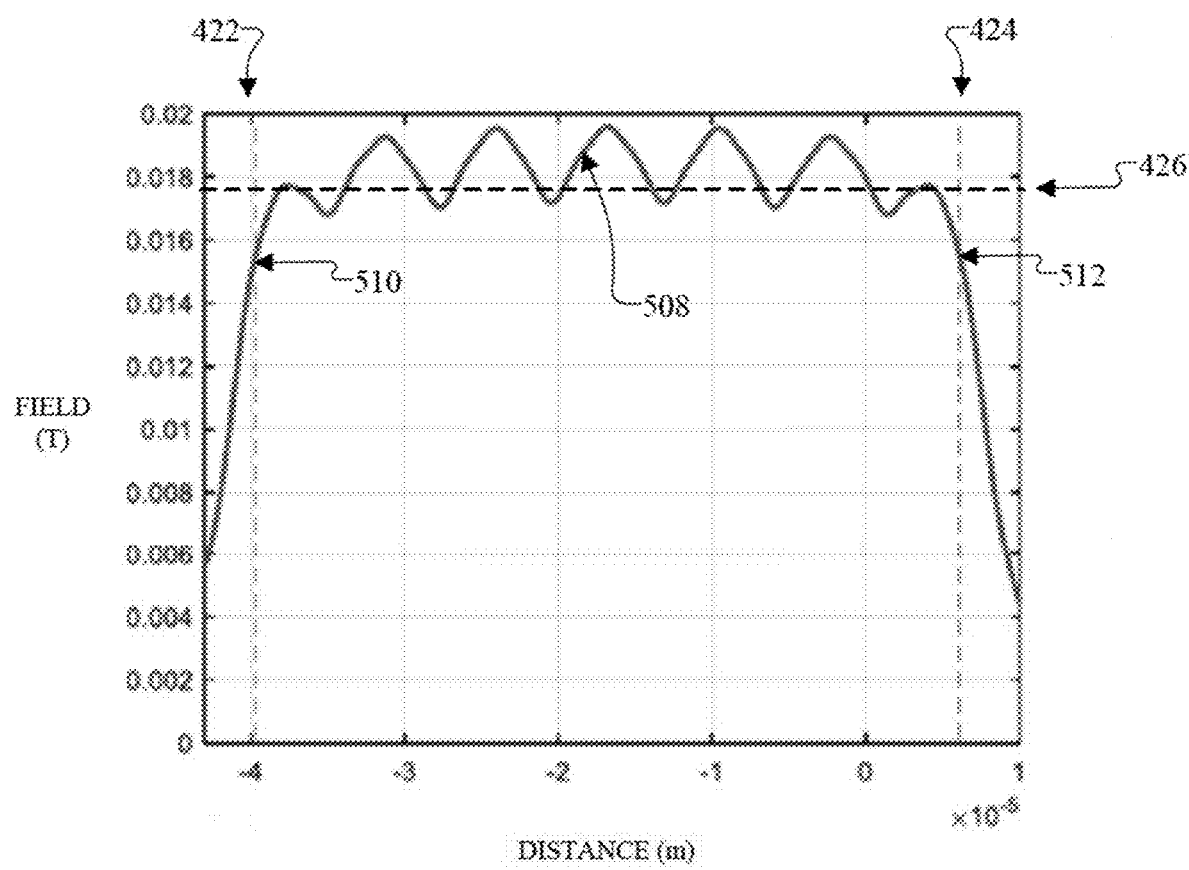
FIG. 5C is a diagram of a graph that illustrates an in-plane component of a total magnetic field density with respect to distance along the flux guide for the flux guide reset mechanism of FIG. 5A according to an example embodiment of this disclosure.

FIGS. 5A, 5B, and 5C illustrate diagrams associated with another configuration of the magnetoresistive sensor assembly 304. More specifically, FIG. 5A is a conceptual diagram that shows a cross-sectional view of a selection of parts of the magnetoresistive sensor assembly 304 that relate to the graphical data of FIGS. 5B and 5C. The configuration of FIG. 5A is similar to FIG. 4A with respect to the sensing elements 314, the flux guide 312, and the first section 400 of the flux guide reset mechanism. However, the second section 402 of the flux guide mechanism of FIG. 5A is different than the second section of the flux guide mechanism of FIG. 4A.

In FIG. 5A, the second section 402 includes the inner region 408 and the outer region 410. The inner region 408 has a layout that includes third coil segments 326A, which are interleaved with the second coil segments 324A such that the second coil 324 and the third coil 326 are arranged in an alternating pattern, as shown in FIG. 5A. In this inner region 408, each second coil segment 324A is associated with and aligned with a corresponding one of the sensing elements 314. In this regard, the inner region 408 of FIG. 5A is the same or substantially similar to the inner region 408 of FIG. 4A. Meanwhile, the outer region 410 of FIG. 5A is different than the outer region 410 of FIG. 4A.

In FIG. 5A, the outer region 410 has a layout that includes a set of third coil segments 326A, which are disposed adjacent to each other. In this example, the outer region 410 includes three loops of the third coil 326 on outer sides of the outermost segments 416 of the second coil segments 324A. More specifically, in this example, the set of third coil segments 326A includes at least the innermost segments 418 and the adjacent segments 420, as discussed earlier. In addition, with regard to the outer region 410, the set of third coil segments 326A includes outermost segments 500, which are positioned on outer sides of the adjacent segments 420, as shown in FIG. 5A.

FIGS. 5B and 5C show in-plane components (y-axis components) of magnetic field profiles, which are sampled at a center region of the flux guide 312. More specifically, FIG. 5B illustrates the magnetic field profile 502 of the first coil 322, the magnetic field profile 504 of the second coil 324, and the magnetic field profile 506 of the third coil 326, respectively, when driven by suitable currents and when sampled at a center region of the flux guide 312. As non-limiting examples, in FIG. 5B, the first coil segments 322A are driven by 170 mA, the second coil segments 324A are driven by 27 mA, the third coil segments 326A are driven by 22 mA.

As shown in FIGS. 5A-5C, this set of third coil segments 326A is configured such that the flux guide reset mechanism is enabled to provide a total magnetic field profile 508 with a magnetic flux density value 510 at one end portion of the flux guide 312 and a magnetic flux density value 512 at an opposite end portion of the flux guide 312 that are closer to the threshold such that the flux guide reset operation is performed more effectively and more uniformly across the length of the flux guide 312. The layout of the set of third coil segments 326A at the outer region 410 is configured to provide a magnetic flux density value at a crest 514 (FIG. 5B), which is substantially greater than a magnetic flux density value at a crest 516 (FIG. 5B) of the layout of the set of third coil segments 326A at the inner region 408. In this configuration, the third coil 326 of FIG. 5A is driven by a current (e.g., 22 mA) that is less than a current (e.g., 26 mA) that drives the third coil 326 of FIG. 4A, whereby the total magnetic flux density values is enhanced at the edges 412 and 414 of the flux guide. By providing a layout with a consecutive pattern of a set of adjacent third coil segments 326A at end portions of the flux guide 312, the third coil 326 is configured to provide a relatively high magnetic field (FIG. 5B) that is enabled to provide total magnetic field enhancement that results in magnetic flux density values 510 and 512 (e.g., 15.5 mT) at these end portions of the flux guide 312 that are closer to the threshold, as indicated by reference line 426, compared to those magnetic flux density values 436 and 438 (e.g., 13 mT) of the total magnetic field profile 434 provided at the edges 412, 414 of the flux guide 312 by the coil configuration of FIG. 4A. In this regard, the observed peak field gain of the configuration of FIG. 5A is about 13% that of the configuration of FIG. 4A in that the peak magnetic flux density for the third coil 326 of FIG. 5A is 2.25 mT/10 mA compared to the peak magnetic flux density of 2 mT/10 mA for the third coil 326 of FIG. 4A. This increase in the observed peak field of the third coil 326 raises the total magnetic flux density values 510 and 512 near the end portions of the flux guide 312 and counterbalances at least the decrease in the second magnetic field at the outer region 410 due to the absence of the second coil 324 in the outer region 410.

In FIGS. 4A and 5A, given general design routing rules, the first coil segments 322A cannot be constructed to have a pitch (D1+W1) that is equal to the pitch (D2+W2) of the sensing elements 314. As such, the examples of FIGS. 4A and 5A are unable to provide coherency between the magnetic field profile 428/502 of the first coil 322 and the magnetic field profile 430/504 of the second coil 324, which is arranged with respect to the sensing elements 314. In contrast, as demonstrated in the examples provided by FIGS. 6A-9, when the first coil 322 is configured to have the same pitch or substantially the same pitch as the sensing elements 314, then the first coil 322 is configured to have the same pitch or substantially the same pitch as the second coil 324. When the first coil 322 is configured to have the same pitch as the second coil 324, then the first coil 322 is configured to generate a magnetic field profile that is coherent with the magnetic field of the second coil 324 such that the total magnetic field profile is flattened across the flux guide, thereby reducing power consumption for the sensor structure 300.

Figure 6A:
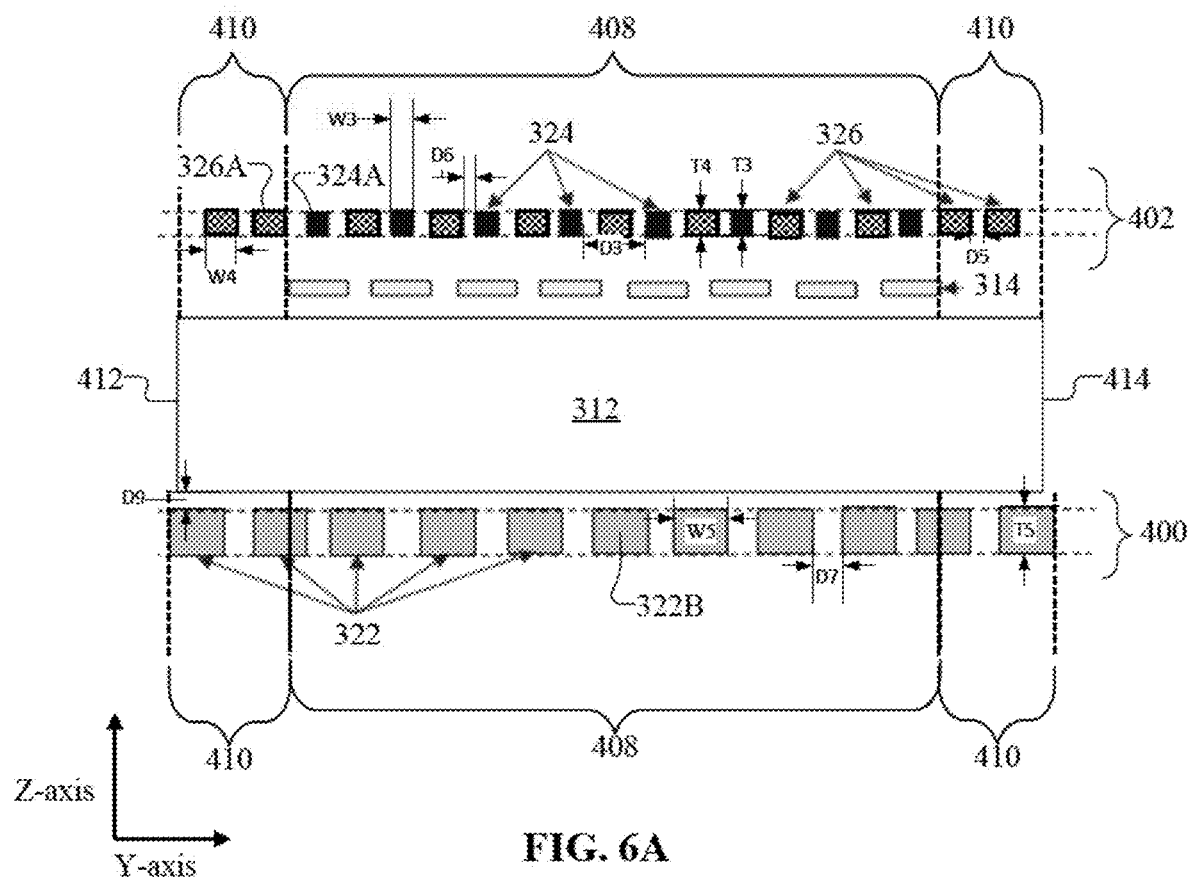
FIG. 6A is a conceptual diagram of a cross-sectional view of a third example of a flux guide reset mechanism in relation to sensing elements and a flux guide according to an example embodiment of this disclosure.
Figure 6B:
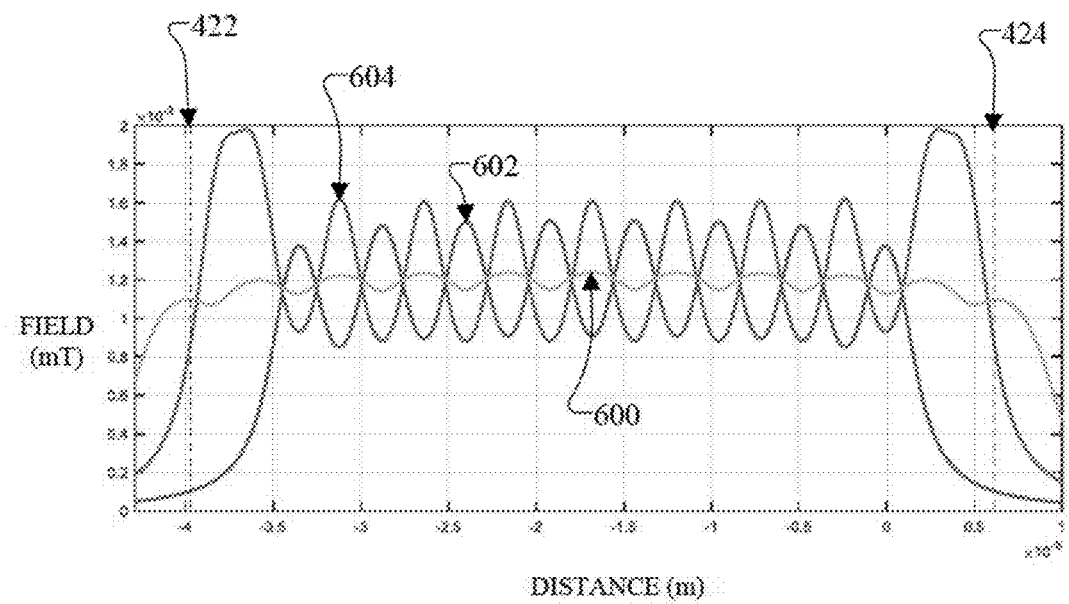
FIG. 6B is a diagram of a graph that illustrates in-plane components of the magnetic field densities with respect to distance along the flux guide for the flux guide reset mechanism of FIG. 6A according to an example embodiment of this disclosure.
Figure 6C:
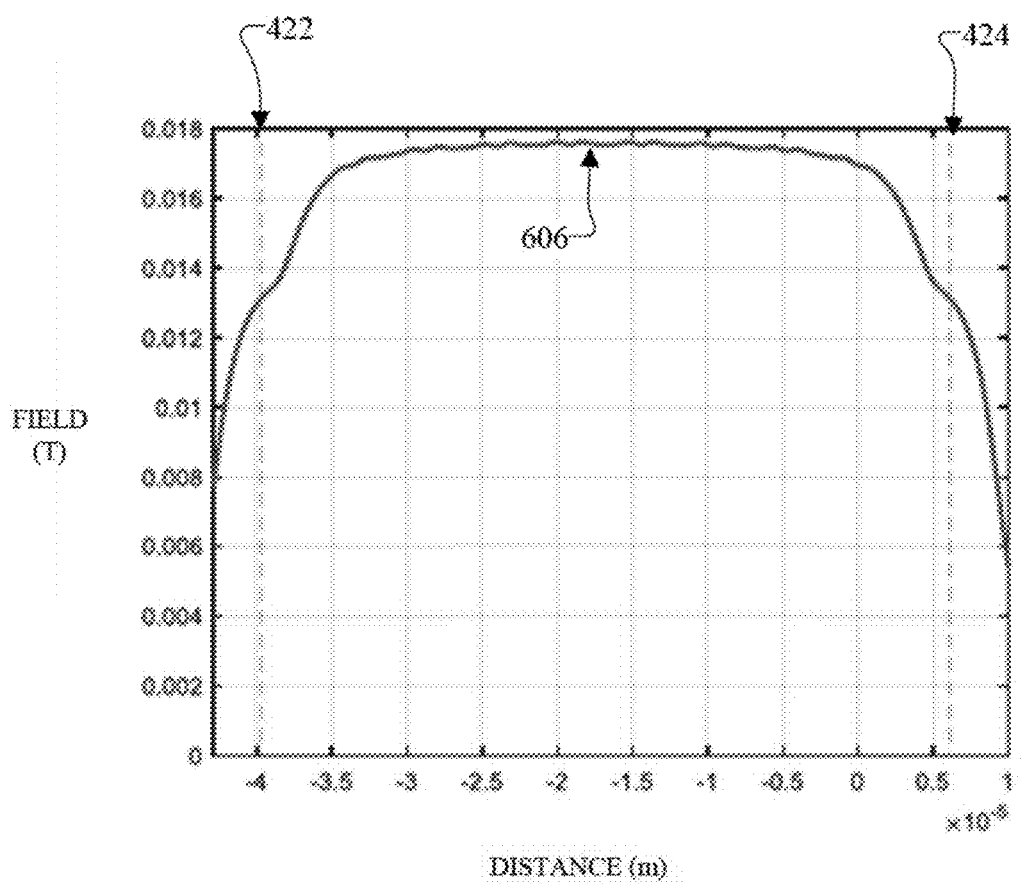
FIG. 6C is a diagram of a graph that illustrates an in-plane component of a total magnetic field density with respect to distance along the flux guide for the flux guide reset mechanism of FIG. 6A according to an example embodiment of this disclosure.

FIGS. 6A, 6B, and 6C illustrate diagrams associated with another configuration of the flux reset mechanism available through a process adjustment that provides a line routing for the first coil 322 that is finer than the line routing for the first coil 322 of FIG. 4A or FIG. 5A. This may involve a process optimization and/or a switch to an alternate interconnect technology (i.e., copper process). Such a process adjustment is advantageous in reducing the distance between the first coil 322 and the flux guide 312 from a distance D8 to a distance D9. In addition, this process adjustment is advantageous in enabling the first coil 322 to be reduced from a thickness T1 for first coil segments 322A comprising aluminum (FIGS. 4A and 5A) to a thickness T5 for first coil segments 322B comprising copper (FIGS. 6A, 7A, 8A, and 9). Also, this process adjustment provides a routing resistivity of a copper process that is substantially similar to the routing resistivity of the aluminum process when employed in the design for the first coil 322.

FIG. 6A is a conceptual diagram that shows a cross-sectional view of the flux guide reset mechanism in relation to a selection of parts of the magnetoresistive sensor assembly 304 that relate to the graphical data of FIGS. 6B and 6C. The configuration of FIG. 6A is similar to FIG. 4A with respect to the sensing elements 314, the flux guide 312, and the second section 402 of the flux guide reset mechanism. However, the first section 400 of the flux guide mechanism of FIG. 6A is different than the first section 400 of the flux guide mechanism of FIG. 4A.

The first section 400 includes a plurality of loops and turns of the first coil 322, which is configured to provide a first magnetic field (with a first magnetic field profile 600) to the flux guide 312 during a flux guide reset operation. For example, in FIG. 6A, the first section 400 includes a relatively tight arrangement of turns of the first coil 322 to provide first coil segments 322B. Each of the first coil segments 322B includes a width W5 and a thickness T5. In this regard, as shown in FIG. 6A, the width W5 is greater than the width W3. The width W5 is greater than the width W4. The thickness T5 is greater than the thickness T3. The thickness T5 is greater than the thickness T4. The first coil 322 is arranged with a distance D7 between adjacent first coil segments 322B along a length of the flux guide 312. The distance D7 is greater than the distance D5. The distance D7 is greater than the distance D6. The distance D7, which is between adjacent first coil segments 322B in the first section 400 of FIG. 6A, is smaller than the distance D1 between adjacent first coil segments 322A in the first section 400 of FIG. 4A. In this regard, the first coil 322 of FIG. 6A has a tighter coil configuration that the first coil 322 of FIG. 4A. A key aspect of the configuration of the first coil 322 of FIG. 6A is that its pitch (W5+D7) is arranged to be the same as the pitch of the sensing elements 314. Also, in FIG. 6A, the pitch (W5+D7) of the first coil segments 322B (or adjacent turns of the first coil 322) is configured to be the same as pitch (W3+D3) of the second coil segments 324A (or adjacent turns of the second coil 324). In this regard, the process adjustment enables the placement of turns of the first coil 322 (or first coil segments 322B) to be at the same pitch as turns of the second coil 324 while being offset by half a pitch, thereby generating magnetic field profiles 600 and 602 that are offset with respect to each other by half a period.

In addition, the dimensions of each first coil segment 322B of FIG. 6A is different than the dimensions of each first coil segment 322A of FIG. 4A. For example, the width W5 of a first coil segment 322B of FIG. 6A is smaller than the width W1 of a first coil segment 322A of FIG. 4A. In addition, the thickness T5 of a first coil segment 322B of FIG. 6A is smaller than the thickness T1 of a first coil segment 322A of FIG. 4A. Also, the number of first coil segments 322B in the first section 400 of FIG. 6A is greater than the number of first coil segments 322A in the first section 400 of FIG. 4A. As a non-limiting example, for instance, FIG. 6A includes eleven first coil segments 322B along the length of the flux guide 312 while the example of FIG. 4A includes seven first coil segments 322A along the length of the flux guide 312. The first coil 322 is enabled to provide this layout of first coil segments 322B relative to the flux guide by having relatively low resistivity. For example, in FIG. 6A, the first coil segments 322B comprise at least copper or any suitable material that is enabled to provide similar results as discussed herein. Moreover, as aforementioned, the configuration of the first coil 322 in FIG. 6A is advantageous in that the distance D9 of the first coil segments 322B from the flux guide 312 is less than the distance D8 of the first coil segments 322A from the flux guide 312.

FIGS. 6B and 6C show in-plane components (y-axis components) of magnetic field profiles, which are sampled at a center region of the flux guide 312. More specifically, FIG. 6B illustrates the first magnetic field profile 600 of the first coil 322, the second magnetic field profile 602 of the second coil 324, and the third magnetic field profile 604 of the third coil 326, respectively, when driven by suitable currents and when sampled at a center region of the flux guide 312. As non-limiting examples, in FIG. 6B, the first coil segments 322B are driven by 110 mA, the second coil segments 324A are driven by 27 mA, and the third coil segments 326A are driven by 9 mA. As shown in FIG. 6B, the peaks (or crests) of the magnetic field profile 600 generated by the first coil 322 are offset from the peaks (or crests) of the magnetic field profile 602 generated by the second coil 324. As a result of this coherent combination and the reduced thickness T5 of the first coil segment 322B comprising copper (when compared to the thickness T1 of the first coil segment 322A comprising aluminum), the current that is needed to drive the coil configuration of FIG. 6A is 40% less than the current that drives the coil configuration of FIG. 4A or FIG. 5A. The coil configuration of FIG. 6A also provides a mean magnetic field of 120 mT/A, which is an improvement over the coil configuration of FIG. 4A, which provides a mean magnetic field of 70 mT/A.

In addition, a comparison of the first magnetic field profile 600 FIG. 6B with the first magnetic field profile 428 of FIG. 4B reveals the differences that the configuration of the first coil segments 322B of FIG. 6A imparts over a length of the flux guide 312 compared to the configuration of the first coil segments 322A of FIG. 4A. The first coil segments 322B of FIG. 6A result in a mean first magnetic field profile 600 that is greater than the mean first magnetic field profile 428 of the first coil segments 322A of FIG. 4A. Also, within the inner region 408 of FIG. 6, the first coil segments 322B are configured in relation to the second coil segments 324A to generate the first magnetic field profile 600 that is coherent with a second magnetic field profile 602. In addition, within the inner region 408 of FIG. 6A, the first coil segments 322B are configured in relation to the third coil segments 326A to generate the first magnetic field profile 600 that is coherent with third magnetic field profile 604. More specifically, within the inner region 408, the first coil segments 322B are configured with respect to the second coil segments 324A such that at least a set of troughs of the first magnetic field profile 600 coincides with a set of crests of the second magnetic field profile 602. Also, within the inner region 408, the first coil segments 322B are configured with respect to the third coil segments 326A such that at least a set of crests of the first magnetic field profile 600 coincides with at least a set of crests of the third magnetic field profile 604.

Meanwhile, for at least the inner region 408, the set of crests of the second magnetic profile 602 and the set of crests of the third magnetic field profile 604 provide an alternating pattern, as shown in FIG. 6B, at least due to the interleaving of the second coil segments 324A with the third coil segments 326A.

FIG. 6C illustrates a total magnetic field profile 606, which is produced by a combination of the first magnetic field profile 600 of the first coil 322, the second magnetic field profile 602 of the second coil 324, and the third magnetic field profile 604 of the third coil 326. FIG. 6C shows that the total magnetic field profile 606 exhibits a plateau or plateau-like shape within the inner region 408 of the flux guide 312. This plateau is advantageous in providing a relatively stable and uniform magnetic flux density at the inner region 408 of the flux guide 312 that coincides with the sensing elements 314. In FIG. 6C, the total magnetic field profile 606 is slightly higher than the threshold (e.g. 17.5 mT) even though the coil configuration of FIG. 6A is configured to be driven by relatively low currents (e.g., 9 mA for the first coil 322 and 110A for the third coil 326) compared to the higher currents that are configured to drive the coil configuration of FIG. 4A.

Figure 7A:
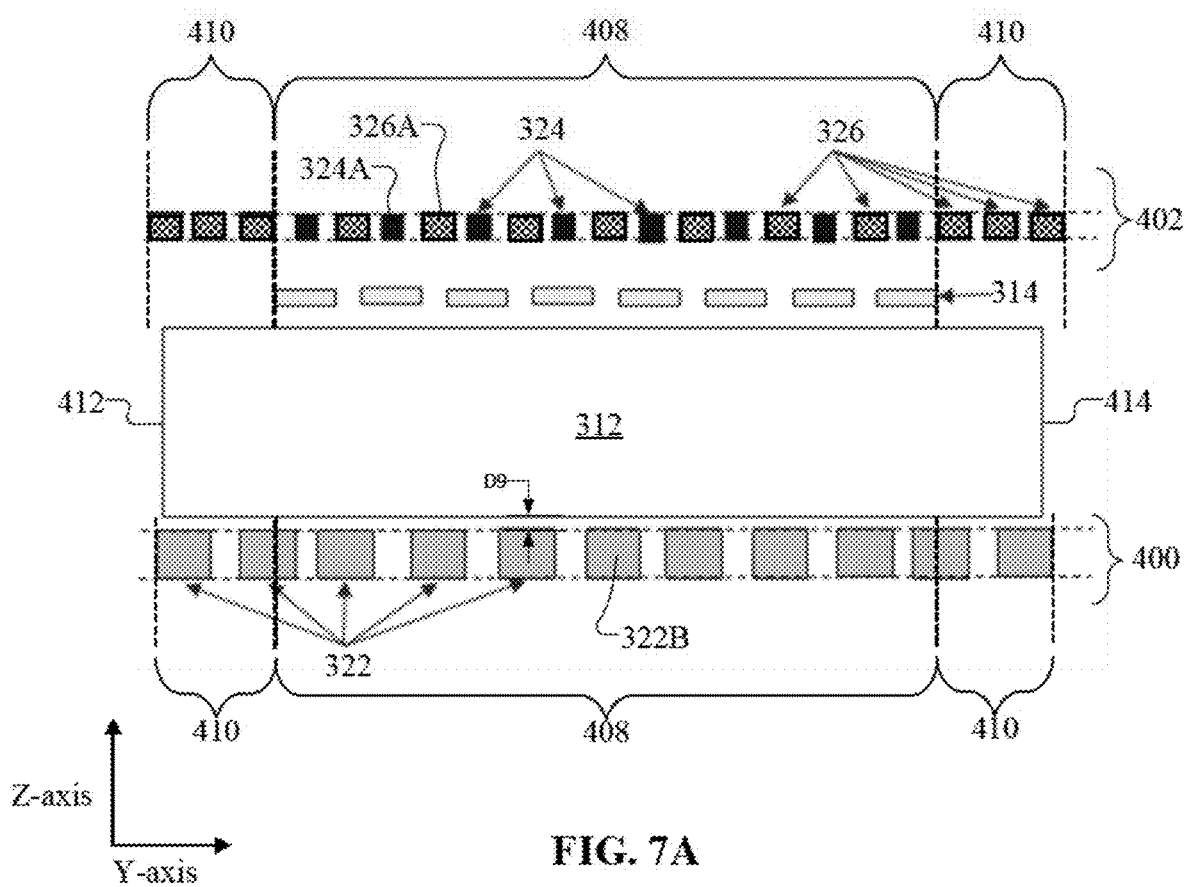
FIG. 7A is a conceptual diagram of a cross-sectional view of a fourth example of a flux guide reset mechanism in relation to sensing elements and a flux guide according to an example embodiment of this disclosure.
Figure 7B:
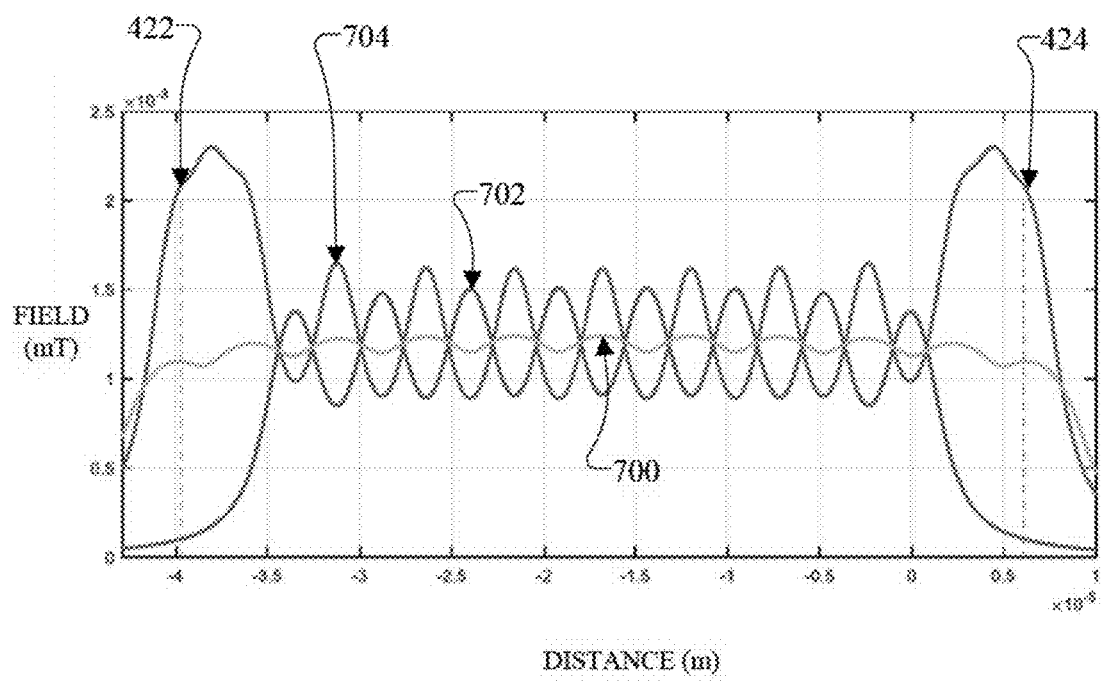
FIG. 7B is a diagram of a graph that illustrates in-plane components of the magnetic field densities with respect to distance along the flux guide for the flux guide reset mechanism of FIG. 7A according to an example embodiment of this disclosure.
Figure 7C:
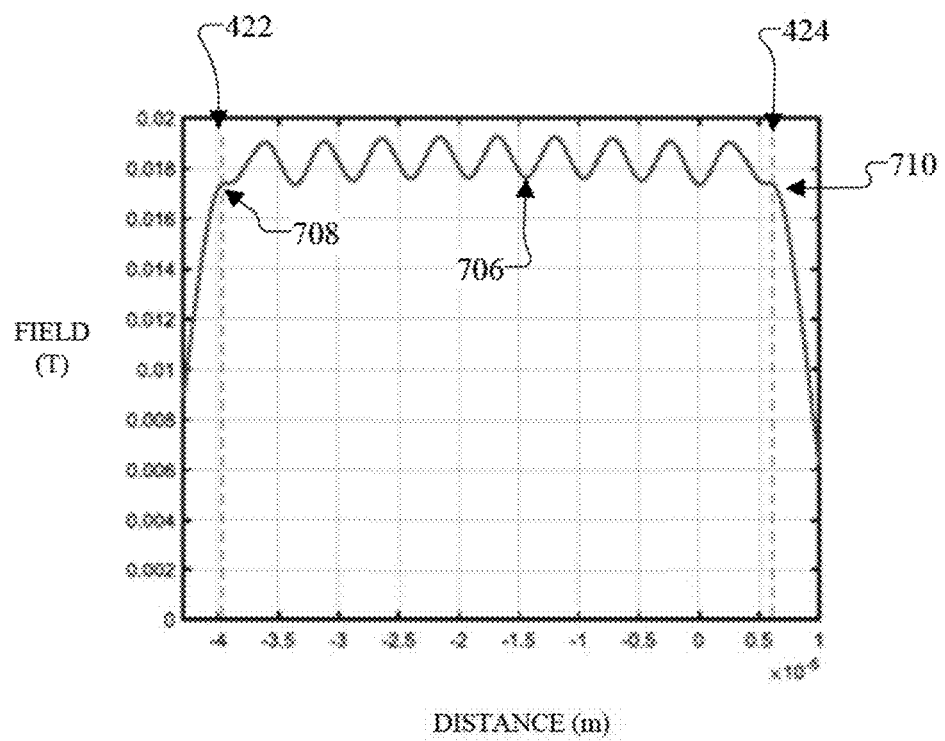
FIG. 7C is a diagram of a graph that illustrates an in-plane component of a total magnetic field density with respect to distance along the flux guide for the flux guide reset mechanism of FIG. 7A according to an example embodiment of this disclosure.

FIGS. 7A, 7B, and 7C illustrate diagrams associated with another configuration of the flux reset mechanism. More specifically, FIG. 7A is a conceptual diagram that shows a cross-sectional view of a selection of parts of the magnetoresistive sensor assembly 304 that relate to the graphical data of FIGS. 7B and 7C. The configuration of FIG. 7A is similar to FIG. 4A with respect to the sensing elements 314 and the flux guide 312. However, the flux guide reset mechanism of FIG. 7A is different than the flux guide mechanism of FIG. 4A. More specifically, the flux guide reset mechanism is provided with the first coil 322 as configured within the first section 400 of FIG. 6A together with the second coil 324 and third coil 326 as configured within the second section 402 of FIG. 5A. This flux guide reset mechanism is advantageous in being configured to provide magnetic field enhancement via the set of third coil segments 326A at the outer region 410 while also being configured to provide coherence at the inner region 408 among the magnetic field profiles of the first coil 322, the second coil 324, and the third coil 326. These features are advantageous in providing a more stable and uniform total magnetic field effect across the entire length of the flux guide 312.

FIGS. 7B and 7C show in-plane components (y-axis components) of magnetic field profiles, which are sampled at a center region of the flux guide 312. More specifically, FIG. 7B illustrates the magnetic field profile 700 of the first coil 322, the magnetic field profile 702 of the second coil 324, and the magnetic field profile 704 of the third coil 326, respectively, when driven by suitable currents. As non-limiting examples, in FIG. 7B, the first coil segments 322B are driven by 115 mA, the second coil segments 324A are driven by 16 mA, and the third coil segments 326A are driven by 22 mA. Meanwhile, FIG. 7C illustrates a total magnetic field profile 706, which is produced by a combination of the magnetic field profile 700 of the first coil 322, the magnetic field profile 702 of the second coil 324, and the magnetic field profile 704 of the third coil 326, as shown in FIG. 7B. Referring to FIG. 7C, the total magnetic field profile 706 exhibits less wasted energy and less pronounced ripples than the total magnetic field 434 of FIG. 4C. Moreover, the configuration of FIG. 7A is advantageous in providing a magnetic flux density value 708 and a magnetic flux density value 710 at the end portions of the flux guide 312 that are closer to the threshold for performing the flux guide reset operation. In FIGS. 7A-7C, the total magnetic field profile 706 is slightly higher than the threshold (e.g. 17.5 mT) even though the configuration of FIG. 7A is driven by lower currents, such as 115 mA for the first coil 322 and 22 mA for the third coil 326, compared to the configuration of FIG. 4A that is driven by 170 mA for the first coil 322 and 26 mA for the third coil 326.

Figure 8A:
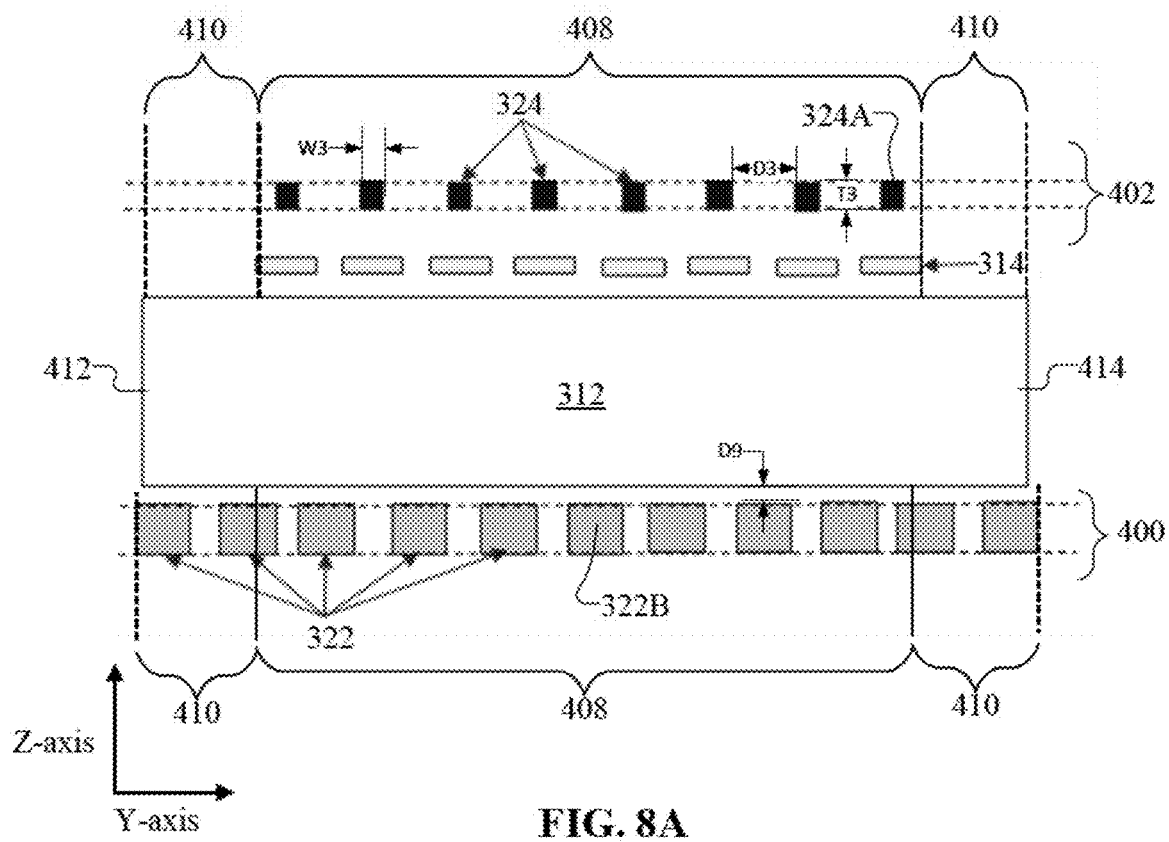
FIG. 8A is a conceptual diagram of a cross-sectional view of a fifth example of a flux guide reset mechanism in relation to sensing elements and a flux guide according to an example embodiment of this disclosure.
Figure 8B:
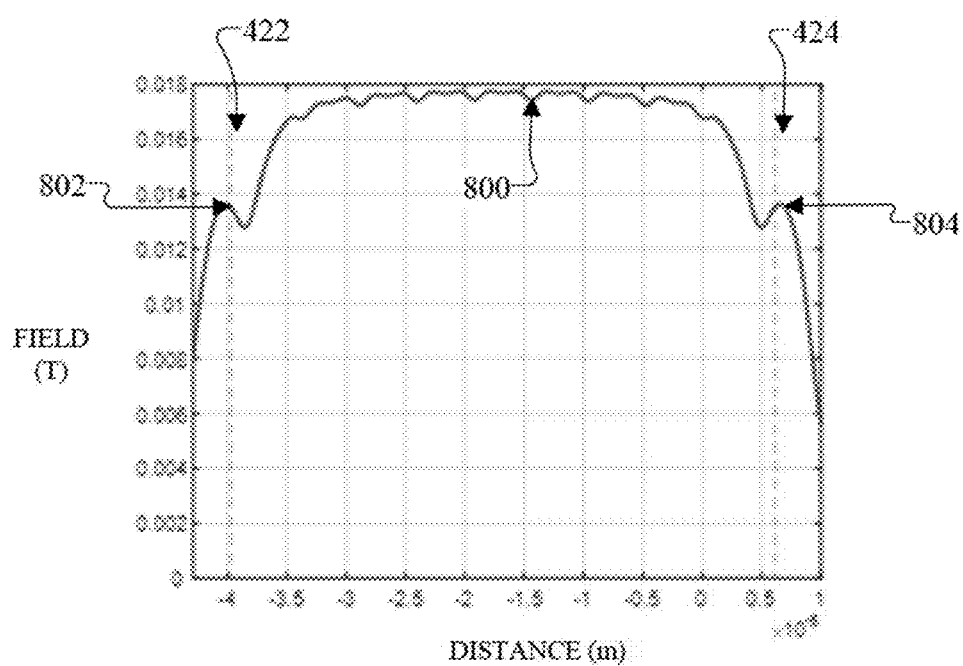
FIG. 8B is a diagram of a graph that illustrates an in-plane component of a total magnetic field density with respect to distance along the flux guide for the flux guide reset mechanism of FIG. 8A according to an example embodiment of this disclosure.

FIGS. 8A and 8B illustrate diagrams associated with another configuration of the flux guide reset mechanism. More specifically. FIG. 8A is a conceptual diagram that shows a cross-sectional view of a selection of parts of the magnetoresistive sensor assembly 304 that relate to the graphical data of FIG. 8B. The configuration of FIG. 8A is similar to FIG. 6A with respect to the sensing elements 314, the flux guide 312, and the first section 400 of the flux guide reset mechanism. However, the second section 402 of the flux guide mechanism of FIG. 8A is different than the second section 402 of the flux guide mechanism of FIG. 6A. In this regard, for instance, the flux guide mechanism of FIG. 8A does not include and/or use a third coil 326 for the flux guide reset operation whereas the flux guide mechanism of FIG. 6A includes and uses a third coil 326 for the flux guide reset operation.

In FIG. 8A, the second section 402 includes the inner region 408 and the outer region 410. The inner region 408 corresponds to portions overlapping the sensing elements 314. The inner region 408 has a layout that includes second coil segments 324A that are configured similar to that of FIG. 6A with respect to its width W3 and thickness T3, as well as the distance D3 between adjacent second coil segments 324A. In this inner region 408, each second coil segment 324A is associated with and aligned with a corresponding one of the sensing elements 314, as discussed above. However, in contrast to the second section 402 of FIG. 6A, the second section 402 of FIG. 8A does not include the third coil 326 in at least the inner region 408. In FIG. 8A, the second section 402 includes a layout of second coil segments 324A, which is within the dielectric layer 330 such that only portions of the dielectric layer 330 reside between adjacent second coil segments 324A along the y-axis.

The outer region 410 corresponds to portions above the flux guide 312 that do not overlap the sensing elements 314. The outer region 410 of FIG. 8A is also different than the outer region 410 of FIG. 6A. As shown in FIG. 8A, the outer region 410 of the second section 402 comprises only at least one dielectric layer 330. The outer region 410 of the second section 402 does not include the second coil segments 324A. The outer region 410 of the second section 402 also does not include third coil segments 326A. In this regard, the outer region 410 of the second section 402 does not include any coil segments. In the outer region 410, the flux guide 312 is overlapped with first coil segments 322B and at least one dielectric layer 330 in the first section 400 and only overlapped with at least one dielectric layer 330 in the second section 402. This provides a simple configuration that provides material savings.

FIG. 8B illustrates an in-plane component (y-axis component) of a total magnetic field profile 800, which is produced by a combination of the magnetic field profile of the first coil 322 of FIG. 8A and the magnetic field profile of the second coil 324 of FIG. 8A, wherein each would have similar magnetic field profiles to the first magnetic field profile 600 and the second magnetic field profile 602, which are shown in at least FIG. 6B. FIG. 8B shows that the total magnetic field profile 800 exhibits a plateau region with less wasted energy and less pronounced ripples than at least the total magnetic field 434 of FIG. 4C. However, the total magnetic field 800 has relatively low magnetic flux density values 802 and 804 at end portions of the flux guide 312 at least since the second section 402 does not have any coils (i.e., no second coil segments 324A and no third coil segments 326A) at the outer region 410. The configuration of FIG. 8A provides a relatively simple flux guide reset mechanism, which is configured to provide a relatively stable and uniform flux guide reset operation that satisfies the threshold with respect to at least the inner region 408, where the sensing elements 314 are located.

Figure 9:
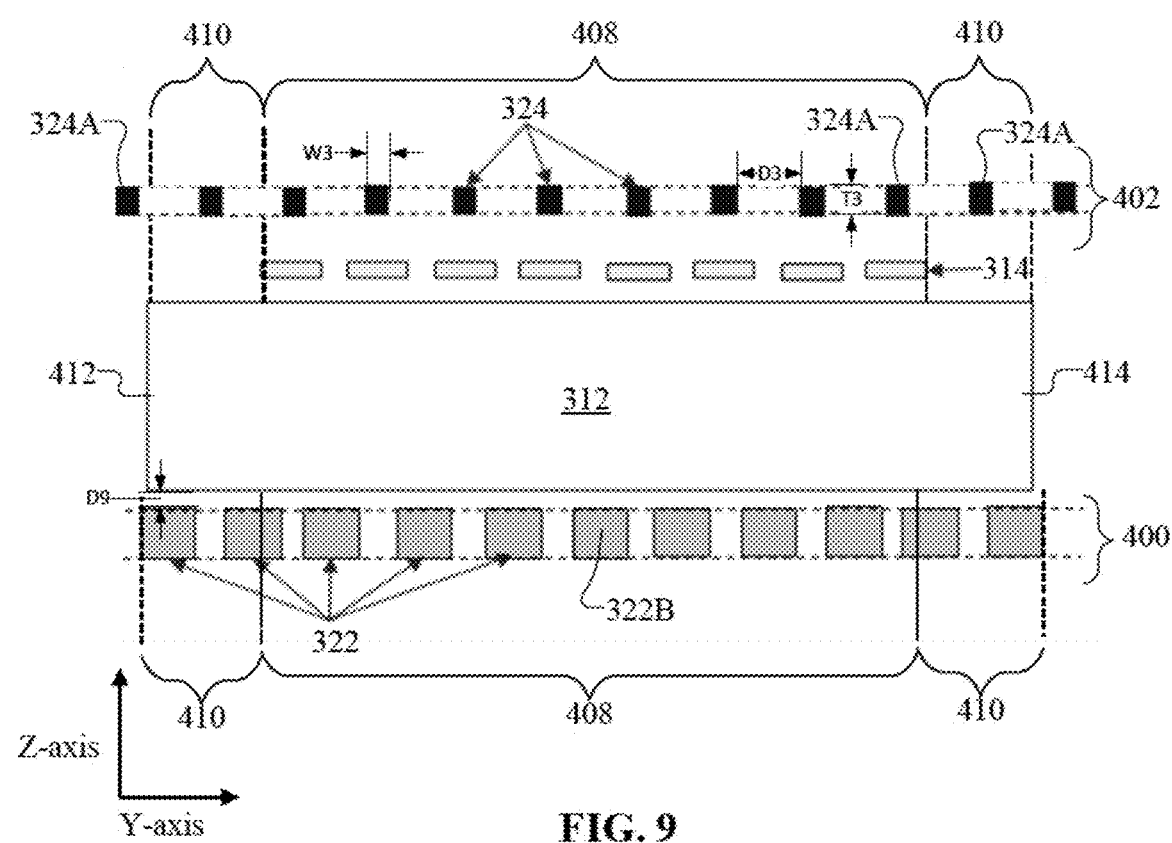
FIG. 9 is a conceptual diagram of a cross-sectional view of a sixth example of a flux guide reset mechanism in relation to sensing elements and a flux guide according to an example embodiment of this disclosure.

FIG. 9 is a conceptual diagram of a cross-sectional view of a sixth example of a flux guide reset mechanism in relation to sensing elements and a flux guide according to an example embodiment. The configuration of FIG. 9 is similar to FIG. 8A with respect to the sensing elements 314, the flux guide 312, and the first section 400 of the flux guide reset mechanism. However, the second section 402 of the flux guide mechanism of FIG. 9 is different than the second section 402 of the flux guide mechanism of FIG. 8A. In this regard, for instance, the flux guide mechanism of FIG. 9 includes additional second coil segments 324A in the outer region 410 whereas the flux guide mechanism of FIG. 8A does not include these additional second coil segments 324A in the outer region 410. Furthermore, in FIG. 9, the flux guide reset mechanism is configured to energize the second coil 324 (i.e., at least the second coil segments 324A in both the inner region 408 and the outer region 410) and the first coil 322 (i.e., at least the first coil segments 322B in both the inner region 408 and the outer region 410) during the flux guide reset operation. Also, in the example shown in FIG. 9, the flux guide reset mechanism is configured to energize a selection of the second coil 324 such that only the second coil segments 324A in the inner region are energized while the second coil segments 324A in the outer region 410 are not energized during a sensing element reset operation. Such a configuration is advantageous in that the additional second coil segments 324A in the outer region 410 are configured to enhance and increase the total magnetic field at the end portions of the flux guide during the flux guide reset operation.

As discussed herein, the embodiments include a number of advantageous features, as well as benefits. For example, the embodiments are configured to apply a more uniform magnetic field to an elongated flux guide 312, thereby contributing to faster and more reliable magnetization switching. The embodiments are configured to provide this relatively uniform total magnetic field while using lower operating currents to drive each of the coils of the flux guide reset mechanism. In addition, there is also an embodiment, which provides a simplified coil layout by using the first coil 322 and the second coil 324 (and not the third coil 326) while optimizing their coil layouts and current values.

These embodiments enable longer battery lives to be sustained in mobile devices (e.g., smart phones, smart watches, tablets, etc.). These embodiments also provide a considerable improvement in the printed circuit board (PCB) design of these mobile devices due to lower current routing requirements, as well as reduced external constraints. Each of the embodiments reduces the voltage and power budget of a flux guide reset operation at least by optimizing a topology that includes at least two coils to provide a relatively uniform magnetic field profile across an entire length of a flux guide 312 while also optimizing the currents that drive each of these coils to utilize that topology advantage.

As described above, the Z-sensor 202 comprises an out-of-plane (Z-axis) tunneling magnetoresistive (TMR) magnetic field sensor that provides a stable output and that minimizes the power needed to operate the Z-sensor 202. The Z-sensor 202 includes at least the first coil 322 that is configured as the flux guide reset coil 208 and a second coil 324 that is configured as the sensing element reset coil 210. In addition, the Z-sensor 202 is also configured to further include a third coil 326 that is configured as the reset assist coil 212. A combination of first coil segments 322A/322B and second coil segments 324A or a combination of first coil segments 322A/322B, second coil segments 324A, and third coil segments 326A are activated to perform a flux guide reset operation, thereby enabling a more accurate read-out of the out-of-plane magnetic field while reducing the power needed to operate the Z-sensor 202. Advantageously, these coil configurations are optimized without degrading performance of the Z-sensor. Moreover, as aforementioned, some of these embodiments contribute to a more uniform field with lower current requirements for a flux guide reset operation by utilizing a custom UTM layer comprising copper as the first coil segments 322B, thereby providing ultra-low resistance and close proximity to the flux guide 312 such that the coupling field from a given voltage source is optimized.

That is, the above description is intended to be illustrative, and not restrictive, and provided in the context of a particular application and its requirements. Those skilled in the art can appreciate from the foregoing description that the present invention may be implemented in a variety of forms, and that the various embodiments may be implemented alone or in combination. Therefore, while the embodiments of the present invention have been described in connection with particular examples thereof, the general principles defined herein may be applied to other embodiments and applications without departing from the spirit and scope of the described embodiments, and the true scope of the embodiments and/or methods of the present invention are not limited to the embodiments shown and described, since various modifications will become apparent to the skilled practitioner upon a study of the drawings, specification, and following claims. For example, components and functionality may be separated or combined differently than in the manner of the various described embodiments, and may be described using different terminology. These and other variations, modifications, additions, and improvements may fall within the scope of the disclosure as defined in the claims that follow.

What is claimed is:

1. A sensor structure comprising:
   sensing elements;
   a flux guide configured to guide magnetic flux in a plane for detection by the sensing elements; and
   a flux guide reset mechanism configured to set the flux guide to a predetermined magnetic orientation during a flux guide reset operation, the flux guide reset mechanism including (i) a first coil configured to generate a first magnetic field, the first coil including first coil segments, (ii) a second coil configured to generate a second magnetic field, the second coil including second coil segments, and (iii) a third coil configured to generate a third magnetic field, the third coil including third coil segments;
   wherein,
   the flux guide is disposed between the first coil and the second coil,
   the second coil segments and the third coil segments are disposed within a dielectric layer, the first coil segments and the second coil segments are configured such that a first magnetic field profile of the first magnetic field is coherent with a second magnetic field profile of the second magnetic field with respect to at least at a portion of the flux guide that overlaps the sensing elements, and the first coil segments and the third coil segments are arranged in relation to each other such that the first magnetic field profile of the first magnetic field is coherent with a third magnetic field profile of the third magnetic field with respect to at least at the portion of the flux guide that overlaps the sensing elements.

2. The sensor structure of claim 1, wherein the first coil segments and the second coil segments are configured such that a set of troughs of the first magnetic field profile coincides and combines with a set of crests of the second magnetic field profile.

3. The sensor structure of claim 2, wherein:
the first coil comprises copper; and
the second coil comprises copper.

4. The sensor structure of claim 3, further comprising:
a sensing element reset circuitry configured to perform a reset operation on the sensing elements, the sensing element reset circuitry including the second coil,
wherein the second coil segments overlap corresponding sensing elements.

5. The sensor structure of claim 1, further comprising:
a sensing element reset circuitry configured to perform a reset operation on the sensing elements, the sensing element reset circuitry including the second coil,
wherein the second coil segments overlap corresponding sensing elements.

6. A sensor structure comprising:
sensing elements;
a flux guide to guide magnetic flux in a plane for detection by the sensing elements, the flux guide including an inner region and an outer region, the inner region including a center portion of the flux guide, the outer region including edges of the flux guide; and
a flux guide reset mechanism to set the flux guide to a predetermined magnetic orientation, the flux guide reset mechanism including (i) a first coil configured to generate a first magnetic field, the first coil including first coil segments that overlap the flux guide, (ii) a second coil configured to generate a second magnetic field, the second coil including second coil segments that overlap the flux guide, (iii) a third coil configured to generate a third magnetic field, the third coil including third coil segments that overlap the flux guide;
wherein,
the flux guide has one side that faces the first coil and another side that faces the second coil and the third coil,
a number of second coil segments that overlap the flux guide is less than a number of third coil segments that overlap the flux guide,
the inner region corresponds to a portion of the flux guide that overlaps the sensing elements,
the inner region overlaps a layout in which the second coil segments are interleaved with a set of the third coil segments within a dielectric layer, and
the outer region overlaps another layout with another set of the third coil segments disposed adjacent to each other within the dielectric layer.

7. The sensor structure of claim 6, wherein the first coil segments and the second coil segments are configured in relation to each other such that a first magnetic field profile of the first magnetic field is coherent with a second magnetic field profile of the second magnetic field with respect to at least at the portion of the flux guide that overlaps the sensing elements.

8. The sensor structure of claim 6, wherein the first coil segments and the third coil segments are arranged in relation to each other such that a first magnetic field profile of the first magnetic field is coherent with a third magnetic field profile of the third magnetic field with respect to at least at the portion of the flux guide that overlaps the sensing elements.

9. The sensor structure of claim 6, wherein:
the first coil comprises copper;
the second coil comprises copper; and
the third coil comprises copper.

10. The sensor structure of claim 6, wherein:
the first coil segments and the second coil segments are arranged in relation to each other such that a set of troughs of a first magnetic field profile coincide with a set of crests of a second magnetic field profile; and
the first coil segments and the third coil segments are arranged in relation to each other such that the set of crests of the first magnetic field profile coincide with a set of crests of a third magnetic field profile.

11. The sensor structure of claim 6, further comprising:
a sensing element reset circuitry configured to perform a reset operation on the sensing elements, the sensing element reset circuitry including the second coil,
wherein the second coil segments overlap corresponding sensing elements.

12. A sensor structure comprising:
sensing elements;
a flux guide to guide magnetic flux in a plane for detection by the sensing elements, the flux guide including an inner region and an outer region, the inner region including a center portion of the flux guide, the outer region including edges of the flux guide; and
a flux guide reset mechanism to set the flux guide to a predetermined magnetic orientation, the flux guide reset mechanism including (i) a first coil configured to generate a first magnetic field, the first coil including first coil segments that overlap the flux guide, (ii) a second coil configured to generate a second magnetic field, the second coil including second coil segments that overlap the flux guide, and (iii) a third coil configured to generate a third magnetic field, the third coil including third coil segments that overlap the flux guide;
wherein,
the flux guide has one side that faces the first coil and another side that faces the second coil and the third coil,
the inner region corresponds to the portion of the flux guide that overlaps the sensing elements,
the inner region overlaps a layout in which the second coil segments are interleaved with a set of the third coil segments in an, alternating pattern within a dielectric layer,
the outer region overlaps another layout with another set of the third coil segments disposed adjacent to each other within the dielectric layer, and
the first coil segments and the third coil segments are configured in relation to each other such that a first magnetic field profile of the first magnetic field is coherent with a third magnetic field profile of the third magnetic field with respect to at least at a portion of the flux guide that overlaps the sensing elements.

13. The sensor structure of claim 12, further comprising:
a sensing element reset circuitry configured to perform a reset operation on the sensing elements, the sensing element reset circuitry including the second coil,
wherein the second coil segments overlap corresponding sensing elements.

14. The sensor structure of claim 12, wherein the third coil is configured to provide a peak value for magnetic flux density within the layout that is less than another peak value for the magnetic flux density within the another layout to stabilize the magnetic flux density along a dimension of the flux guide.

15. The sensor structure of claim 12, wherein the first coil segments and the second coil segments are configured in relation to each other such that the first magnetic field profile of the first magnetic field is coherent with a second magnetic field profile of the second magnetic field with respect to at least at the portion of the flux guide that overlaps the sensing elements.

16. The sensor structure of claim 12, wherein:
the first coil comprises copper;
the second coil comprises copper; and
the third coil comprises copper.

* * * * *